United States Patent
Giovannini et al.

(10) Patent No.: US 11,573,849 B2
(45) Date of Patent: Feb. 7, 2023

(54) MEMORY MODULE REGISTER ACCESS

(71) Applicant: Rambus Inc., San Jose, CA (US)

(72) Inventors: Thomas J. Giovannini, San Jose, CA (US); Catherine Chen, Cupertino, CA (US); Scott C. Best, Palo Alto, CA (US); John Eric Linstadt, Palo Alto, CA (US); Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/236,445

(22) Filed: Apr. 21, 2021

(65) Prior Publication Data

US 2021/0303383 A1    Sep. 30, 2021

Related U.S. Application Data

(63) Continuation of application No. 16/183,470, filed on Nov. 7, 2018, now Pat. No. 11,016,837, which is a continuation of application No. 15/090,399, filed on Apr. 4, 2016, now Pat. No. 10,146,608.

(60) Provisional application No. 62/233,579, filed on Sep. 28, 2015, provisional application No. 62/143,707, filed on Apr. 6, 2015.

(51) Int. Cl.
| | |
|---|---|
| *G06F 11/07* | (2006.01) |
| *G11C 29/44* | (2006.01) |
| *G06F 13/00* | (2006.01) |
| *G11C 5/04* | (2006.01) |
| *G11C 7/20* | (2006.01) |
| *G11C 8/12* | (2006.01) |
| *G11C 29/26* | (2006.01) |

(52) U.S. Cl.
CPC ........ *G06F 11/079* (2013.01); *G06F 11/073* (2013.01); *G06F 11/0772* (2013.01); *G06F 13/00* (2013.01); *G11C 5/04* (2013.01); *G11C 7/20* (2013.01); *G11C 8/12* (2013.01); *G11C 29/26* (2013.01); *G11C 29/44* (2013.01)

(58) Field of Classification Search
CPC .......... G06F 11/073; G11C 5/04; G11C 7/20; G11C 8/12; G11C 29/26
See application file for complete search history.

(56) References Cited

U.S. PATENT DOCUMENTS

| | | |
|---|---|---|
| 5,247,622 A | 9/1993 | Choi |
| 6,311,246 B1 | 10/2001 | Wegner et al. |
| 6,742,098 B1 | 5/2004 | Halbert et al. |

(Continued)

*Primary Examiner* — Yolanda L Wilson
(74) *Attorney, Agent, or Firm* — The Neudeck Law Firm, LLC

(57) ABSTRACT

During system initialization, each data buffer device and/or memory device on a memory module is configured with a unique (at least to the module) device identification number. In order to access a single device (rather than multiple buffers and/or memory devices), a target identification number is written to all of the devices using a command bus connected to all of the data buffer devices or memory devices, respectively. The devices whose respective device identification numbers do not match the target identification number are configured to ignore future command bus transactions (at least until the debug mode is turned off.) The selected device that is configured with a device identification number matching the target identification number is configured to respond to command bus transactions.

20 Claims, 16 Drawing Sheets

(56) References Cited

U.S. PATENT DOCUMENTS

| | | | |
|---|---|---|---|
| 7,627,869 B2 | 12/2009 | Goff et al. | |
| 7,715,450 B2 | 5/2010 | Ohara | |
| 8,559,258 B1 * | 10/2013 | Stephens, Jr. | G11C 5/14 365/222 |
| 8,861,277 B1 | 10/2014 | Rategh et al. | |
| 9,997,233 B1 * | 6/2018 | Ware | G06F 13/1678 |
| 2008/0031077 A1 * | 2/2008 | Bartley | G11C 29/26 365/230.06 |
| 2008/0155219 A1 * | 6/2008 | Pyeon | G11C 7/10 711/170 |
| 2009/0094407 A1 * | 4/2009 | Roohparvar | G11C 7/20 711/E12.008 |
| 2010/0003837 A1 | 1/2010 | Loughner et al. | |
| 2013/0073754 A1 | 3/2013 | Pyeon et al. | |
| 2013/0094271 A1 * | 4/2013 | Schuetz | G11C 16/08 365/63 |
| 2013/0128678 A1 * | 5/2013 | Pyeon | G11C 7/225 365/194 |
| 2013/0301207 A1 | 11/2013 | Chun et al. | |

* cited by examiner

MEMORY MODULE REGISTER ACCESS

DETAILED DESCRIPTION OF THE EMBODIMENTS

Access to internal registers/state of the components on a memory module while that module is installed can help improve system debugging and failure analysis. This access can include read and write access to registers in the memory devices, a registering clock driver (RCD) device, and/or data buffer devices. This type of access can help determine which device on the memory module caused a failure and/or error.

In an embodiment, when one or more command busses on the module do not independently address each device on the module, the internal registers/state of data buffer devices and/or memory device may not be independently accessible while the module is installed in a system. This lack of independent access includes not being able to independently access certain devices on the module via a side-channel bus (e.g., I2C, SMBus). This lack of independent access may be a result of the side-channel bus being connected to a registering clock driver, but not being connected directly to the buffer devices or the memory devices.

During system initialization, each data buffer device and/or memory device is configured with a unique (at least among components on the module) device identification number. In order to access a single device (rather than multiple buffers and/or memory devices), a target identification number is written to all of the devices using a command bus connected to all of the data buffer devices or memory devices, respectively.

The devices whose respective device identification numbers do not match the target identification number are configured to ignore future command bus transactions (at least until the debug mode is turned off, or the target identification number is changed.) The selected device is configured with a device identification number that matches the target identification number. This selected device is configured to respond to command bus transactions. The selected device can perform commands that can include register read commands that serialize the contents of a register for output by the device. Successive writes via the command bus to the selected device cause the serialized contents of the register to be output, one bit at a time, to an error signal pin. This error signal pin is connected to the RCD device and is shared by at least all of the buffer devices, or all of the memory devices, respectively. A side-channel bus connected to the RCD device is used to read each of the serialized bits from the error signal, or from an internal register that is set/reset by the error signal.

Figure 1:
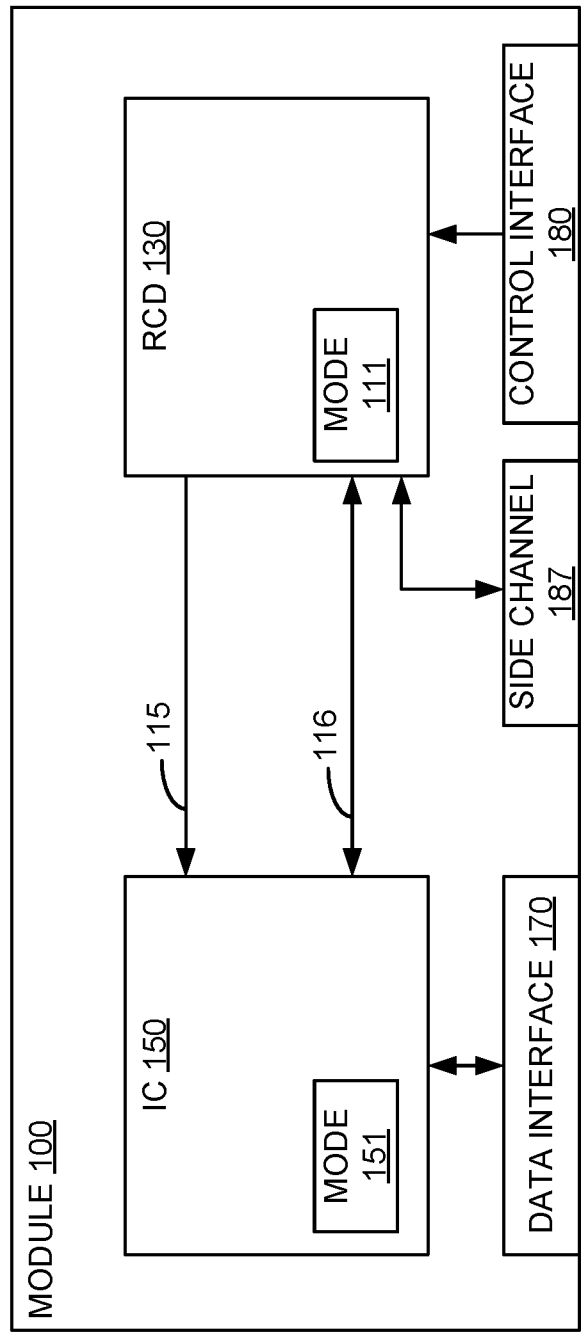
FIG. 1 illustrates a memory module.

FIG. 1 illustrates a memory module. In FIG. 1, memory module 100 comprises registering clock driver (RCD) 130, integrated circuit (IC) 150, data interface 170, control interface 180, and side-channel interface 187. RCD 130 includes mode circuitry 111. IC 150 includes mode circuitry 151. Data interface 170 is operatively coupled to IC 150. RCD 130 is operatively coupled to control interface 180 and side-channel interface 187. RCD 130 is operatively coupled to IC 150 by internal module control interface 115 and internal interface 116.

Module 100 may be constructed as a wide-data mode in which module 100 communicates 18 four-bit data nibbles (72 data bits—i.e., 9 8-bit data bytes) in parallel via data interface 170, and is compatible with what is conventionally termed a "DDR4 LRDIMM chipset." DDR4 (for "double-data-rate, version 4") is a type of dynamic, random-access memory (DRAM) die, and LRDIMM (for "load reduced, dual inline memory module") is a type of memory module that employs a separate system of buffers to facilitate communication with the memory dies. Module 100 may be constructed to support a narrow-data mode in which module 100 communicates nine four-bit data nibbles (36 data bits) in parallel via data interface 170, and that can be used in support of improved signaling integrity, higher signaling rates, and increased system memory capacity.

In an embodiment, module 100 may include memory devices (e.g., IC 150) on one or each side. IC devices 150 may be packaged to include multiple die, or multiple stacked packages to form multi-die components. These IC's 150 and/or multi-die components can be mounted to one or both sides of module 100. In an embodiment, module 100 may include data-buffer devices (e.g., IC 150), or "data buffers." Each data-buffer device can steer data from multiple memory components to/from data interface 170. Thus, it should be understood that IC 150 in FIG. 1 illustrates either a memory device (e.g., DRAM, SRAM, nonvolatile, RRAM, HMC, etc.), a data-buffer device, or both, depending upon the design and configuration of module 100.

To interface with module 100, a memory controller (not shown) directs command, address, and control signals control interface 180 to control the flow of data to and from module 100 via data interface 170. RCD 130, alternatively called a "Address-buffer component," selectively interprets and retransmits the control signals received via control interface 180 on a module control interface 115 to IC 150. Errors or other information may be signaled by IC 150 using interface 116.

In an embodiment, side-channel interface 187 can be used to read/write registers internal to RCD 130, to control output signals (e.g., module command bus 115), and to read input signals (e.g., interface 116.) Side-channel interface 187 may be, for example, an Inter-Integrated Circuit (a.k.a., I2C, I²C, or IIC), SMBus, or the like.

During initialization of module 100, a host (not shown in FIG. 1) can configure IC 150 with a device identification number. The host may configure IC 150 with a device identification number (device ID) using control interface 180. The host may configure RCD 130 to perform a write transaction to IC 150 via module control interface 115. This write transaction causes the device identification number to be written to IC 150. The device identification number may be stored in mode circuitry 151. The host may select IC 150 as the target for a write via module control interface 115 by asserting one or more data lines on data interface 170. These one or more data lines can act as a chip select for accesses to IC 150 and/or other devices (not shown in FIG. 1) that are connected to module control interface 115.

To access IC 150 during system operation, the host, or another system coupled to side-channel interface 187, configures RCD 130 to allow IC 150 to be accessed via side-channel interface 187. The mode that allows IC 150 to be accessed may be set in mode circuitry 111.

RCD 130 is controlled (e.g., via side-channel interface 187) to write a target device identification number (target ID) to IC 150, and any other devices connected to module control bus 115. RCD 130 is also controlled (e.g., via side-channel interface 187) to place IC 150, and any other devices connected to module control bus 115, in an in-system access mode (e.g., by setting a value in mode circuitry 151). When the device identification number of IC 150 matches the target device identification number (and in-system access mode is enabled for IC 150), IC 150 is configured to respond to additional transactions on module control bus 115. When the device identification number of IC 150 does not match the target device identification number, IC 150 is configured to ignore most transactions on module control bus 115.

In other words, the match between the target ID and the device ID enable IC 150 to respond to transactions on module control bus 115. A mismatch between the target ID and device ID disables IC 150 from responding to most transactions on module control bus 115. In this manner, IC 150 may be selected to respond to (and/or ignore) transactions on module control bus 115. This allows transactions on module control bus 115 to be broadcast to multiple devices on module control bus 115, but then have only a selected (i.e., IC 150) device respond to these broadcast transactions.

In an embodiment, IC 150 is not dependent upon a match between the target-ID and the device ID to set or clear the in-system access mode for IC 150. This allows all of the devices connected to module control bus 115 to be returned to normal operation (i.e., not in-system access mode) even when they are not addressed by the target ID. Likewise, the module control bus transaction that writes the target ID to IC 150 and other devices is not dependent upon a match between the target ID and the device ID. This allows the target ID to be written to all of the devices connected to the module bus so that each device can determine whether the target ID matches the device ID stored by each respective device.

Side-channel interface 187 can control RCD 130 to write a value to a register in IC 150. This register, however, is only enabled to be written in IC 150 if the last written target ID matches the device ID stored by IC 150. If the last written target ID does not match the device ID stored by IC 150, the write transaction issued by RCD 130 is directed to a different device than IC 150 (i.e., a device that does have a match.)

Side-channel interface 187 can control RCD 130 to read a value from a register in IC 150. This register, however, is only enabled to be read from IC 150 if the last written target ID matches the device ID stored by IC 150. If the last written target ID does not match the device ID stored by IC 150, the transaction(s) issued by RCD 130 to read the register is directed to a different device than IC 150 (i.e., a device that does have a match.)

In an embodiment, module control interface 115 is uni-directional. In other words, data from a register being read while IC 150 is in in-system access mode is not returned to RCD 130 via module control interface 115. In an embodiment, data from a register being read while IC 150 is in in-system access mode is returned to RCD 130 via interface 116. For example, interface 116 may be at least one dedicated signal connection for providing data from IC 150 to RCD 130 while IC 150 is in in-system access mode.

In another example, interface 116 may be a signal connection used to send an error signal from IC 150 to RCD 130 when IC 150 is in normal operation. When IC 150 is in the in-system access mode, interface 116 can be re-purposed to send data (e.g., the contents of a register) from IC 150 to RCD 130. In an embodiment, interface 116 is shared by other devices connected to module control interface 115. However, since the device ID's of these devices can be configured to be unique, only one of the devices connected to module control interface 115 will respond and provide data on interface 116.

In an embodiment, once IC 150 is in in-system access mode, and IC 150 has determined that the target ID matches IC 150's device ID, the following process may be used to read a register of IC 150. The following process may be controlled by side-channel interface 187. (1) RCD 130 is controlled to issue a read to the desired register of IC 150 via module control bus 115. (2) RCD 130 is controlled to issue a read first bit command to IC 150 via module control bus 115. This causes the first bit(s) of the desired register to be output to interface 116. Other devices connected to module control bus 115 do not output bit(s) because their device ID's do not match the target ID. (3) The first bit(s) of the desired register are read from the interface 116 input to RCD 130 using the side-channel interface. (4) RCD 130 is controlled to issue a read next bit command to IC 150 via module control bus 115. This causes the next bit(s) of the desired register to be output to interface 116. Other devices connected to module control bus 115 do not output bit(s) because their device ID's do not match the target ID. (5) These bit(s) of the desired register are read from the interface 116 input to RCD 130 using the side-channel interface 187. (6) Steps (4) and (5) may be repeated until the contents of the desired register have been successfully read from IC 150.

Figure 2:
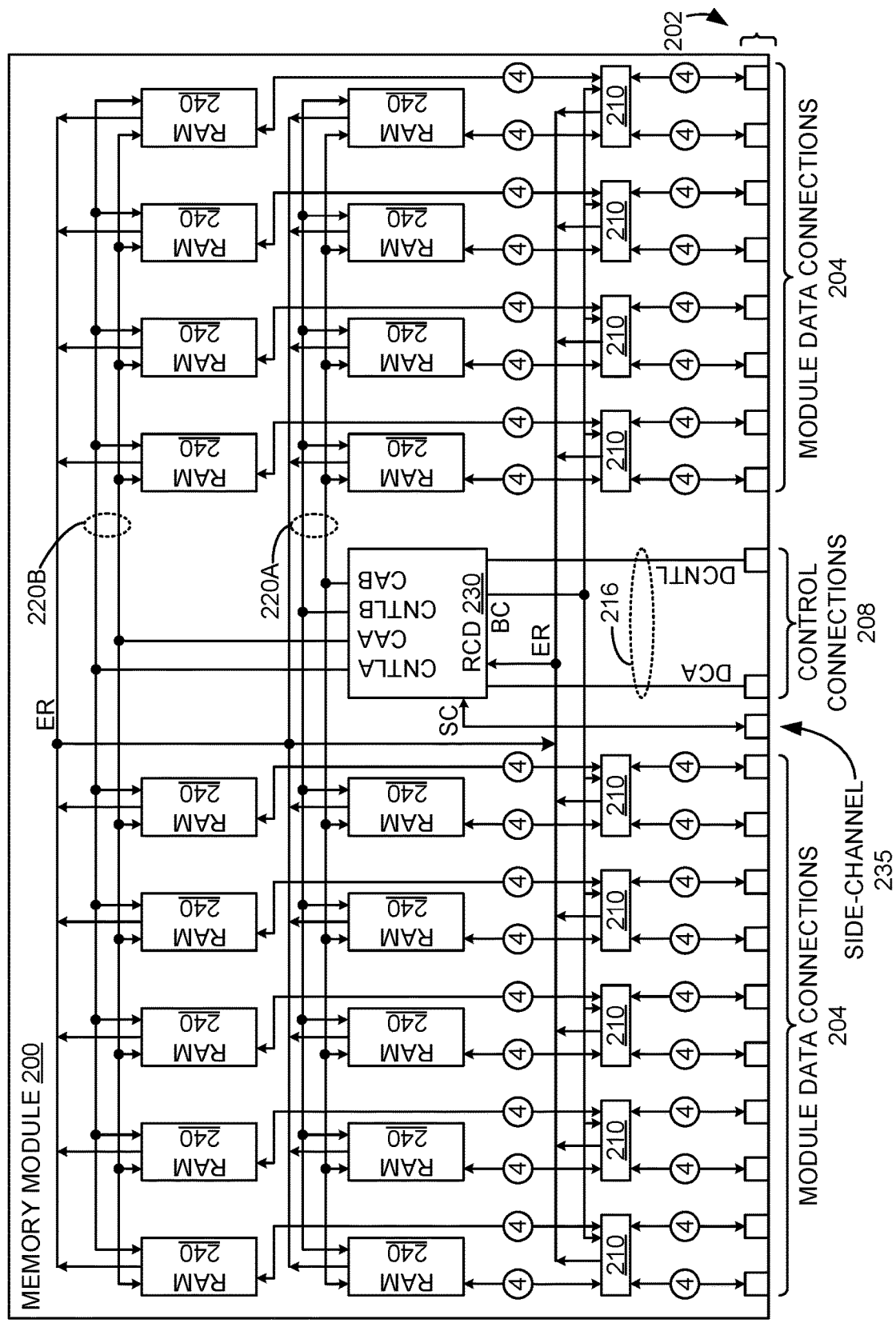
FIG. 2 illustrates a load reduced memory module that can be configured to support different data widths.

FIG. 2 illustrates a memory module that can be configured to support different data widths. In FIG. 2, module 200 supports a wide-data mode in which module 200 communicates 18 four-bit data nibbles (72 data bits—i.e., 9 8-bit data bytes) in parallel, and is compatible with DDR4 LRDIMM. Module 200 can be configured to support a narrow-data mode in which module 200 communicates nine four-bit data nibbles (36 data bits) in parallel. This configuration can be used in support of improved signaling integrity, higher signaling rates, and increased system memory capacity.

Module 200 includes e.g. eighteen memory components 240 on one or each side. Each memory component 240 may include multiple memory (e.g., DRAM) die, or multiple die stacked packages. Each component 240 communicates via a four-bit-wide (x4, or a "nibble") interface. In other embodiments, different data widths and different numbers of components and dies can be used. Components 240 can be mounted to one or both sides of module 200. Module 200 also includes nine data-buffer components 210, or "data buffers." Each data-buffer component 210 steers data, at the direction of a control bus (BC), from four memory components 240 to and from data ports of a module data connector 204. Each memory component 240 communicates x4 data. The ports of module data connections 204 may be each associated with one of two data ports that are each 36 bits wide. In the wide mode, each buffer component 210 communicates x8 data (i.e., two 4 bit nibbles) from two simultaneously active memory components 240. In the narrow mode, each buffer component 210 communicates x4 data from a single active memory component 240. Though not shown here, each memory component 240 also communicates a complementary pair of timing reference signals (e.g. strobe signals) that time the transmission and receipt of data signals.

A memory controller (not shown) directs command, address, and control signals on control connections 208 (i.e., ports DCA and DCNTL) to control the flow of data to and from module 200 via groups of data links to module data connections 204. RCD 230 selectively interprets and retransmits the control signals on a module control interface 216 (i.e., signals DCA and DCNTL) from module control connections 208 and communicates appropriate command, address, and control signals to a first set of memory components 240 via a first memory-component control interface 220A and to a second set of memory components via a second memory-component control interface 220B. Addresses associated with the commands on primary port DCA identify target collections of memory cells (not shown) in components 240, and chip-select signals on primary port DCNTL and associated with the commands allow RCD 130 to select individual integrated-circuit memory dies, or "chips," for both access and power-state management. Buffer components 210 and 230 each acts as a signal buffer to reduce loading on module connector 202. This reduced loading is in large part because each buffer component presents a single load to module connector 202 in lieu of the multiple memory device dies each buffer component serves. Each of the nine data-buffer components 210 communicates eight-wide data (i.e., two sets of four-bit data) for a total of 72 data bits.

In an embodiment, RCD 230 controls buffer components 210 via a shared, unidirectional, module control bus, BC. Typically, registering clock driver 230 interprets commands and addresses received via control connections 208. These commands and addresses are interpreted in order to control buffer components 210 and memory devices 240. Buffer components 210 are controlled by shared unidirectional buffer control bus, BC. BC does not individually address buffer components 210. Thus, when RCD sends a command via BC, that command is received and performed by all of buffer components 210. If a buffer component 210, or a memory component 240 detects an error, the respective buffer component 210 or memory component 240 signals that error to RCD 230 via a unidirectional error signal, ER.

Side-channel 235 is not directly coupled to buffer components 210. Thus, buffer components 210 may not be controlled, or have their registers accessed directly by side-channel 235.

To access registers internal to buffer components 210, RCD 230 and buffer components 210 may be placed in an in-system access mode that allows side-channel 235 to access registers in an individually addressed buffer component 210. In other words, when configured into in-system access mode, RCD 230 can be controlled by side-channel 235 to access an individual buffer component 210 without accessing the other buffer components 210. The in-system access mode allows side-channel 235 to access (e.g., read/write) the registers of an individual buffer component 210 while module 200 is installed in a host system, and without using module data connections 204 (which may interfere with normal functioning of the host.)

Before side-channel 235 can individually access a buffer component 210, each buffer component 235 is configured with a unique (at least among buffer components 210) device ID. The unique device ID numbers can each be stored by a respective buffer component 210.

Each buffer component may be configured with a unique device ID during the initialization (i.e., not normal operation) of module 200. Because this configuration takes place during initialization and not normal operation, the host system may use the module data connections 204 to select an individual buffer component 210 (and de-select the rest) to receive a write command directed to setting the device ID of that buffer component. This method of individually accessing a buffer component 210 may be referred to as "per buffer access." Once the host has configured each buffer component 210 with unique ID numbers, the system can finish initializing module 200 (and the rest of the system) and start normal operation.

In an embodiment, some BC commands should be performed by buffer components 210 regardless of whether their target ID register matches their respective device ID register. For example, a buffer component 210 should respond and perform a BC command that exits the in-system access mode regardless of a match. This allows all of the buffer components 210 to be returned to normal operation without being individually selected (although individual selection and control could also be used to sequentially cause each buffer component 210 to exit in-system access mode.) Also, a BC command that sets the target ID register should also be performed even though the target ID does not match the device ID so that the target ID can be changed to address a different individual buffer component 210.

After initialization, individual registers of individual buffer components 210 can be accessed using side-channel 235. To access (i.e., read or write) a register using side-channel 235, side-channel 235 is used to place RCD 230 and buffer components 210 in an in-system register access mode. A write command on BC is used to place buffer components 210 in the in-system register access mode. It should be noted that before placing RCD 230 and/or buffer components 210 in the in-system register access mode, error checking should be disabled in memory components 240. This prevents a memory component 240 from asserting an error on the ER signal that may interfere with the operation of the in-system register access mode or other operations of the host system. In addition RCD 230 can, at least while in the in-system register access mode, be configured to prevent the signaling of errors to the host system.

Disabling the propagation of the ER signal outside of RCD 230 and/or module 200 helps allow the usage of the ER signal for the data channel between the buffer components 210 and RCD 230. The ER signal is typically coupled to a system-side ALERT signal (e.g., one of control connections 208.) The system-side ALERT signal should be disabled during in-system register access mode so that data transfers between buffer components 210 and RCD 230 do not cause the system-side ALERT to be asserted to the system via control connections 208. In an embodiment, the write command that places buffer components 210 in the in-system register access mode can be performed regardless of whether a particular device ID matches the target ID.

Once RCD 230 and buffer components 210 are in the in-system register access mode, side-channel 235 is used to cause RCD 230 to issue a write command on buffer control bus BC to set a target device ID register in all of buffer components 210. The write command that sets the target device ID register in buffer components 210 is performed regardless of whether a particular device ID matches the target ID. When the value in the target device ID register matches the value in the device ID register of a buffer component 210, then the respective buffer component 210 is enabled to process additional commands received via the buffer control bus BC. When the value in the target device ID register does not match the value in the device ID register of a buffer component 210, then the respective buffer component is disabled from processing most commands received via the buffer control bus BC.

To perform a write to a register in a single buffer component 210, side-channel 235 is used to cause RCD 230 to issue a write command on buffer control bus BC to set the target device ID register in all of the buffer components 210. This target device ID should match only one device ID and thereby enable only one buffer component 210 to respond to the command(s) that follow. Side-channel 235 is used to cause RCD 230 to issue a write command. Since only one buffer component 210 is enabled to respond to the write command (because only one buffer component 210 has a matching device ID and target device ID), the write command to the addressed register is only performed by the targeted buffer component 210. The rest of the buffer components (i.e., those not targeted) do not perform the write command and therefore the addressed register is not affected in the buffer components 210 that were not the target of the write command.

To perform a read of a register in a single buffer component 210, side-channel 235 is used to cause RCD 230 to issue a write command on buffer control bus BC to set the target device ID register in all of the buffer components 210. This target device ID should match only one device ID and thereby enable only one buffer component 210 to respond to the command(s) that follow. Side-channel 235 is used to cause RCD 230 to issue a read command. Since only one buffer component 210 is enabled to respond to the read command (because only one buffer component 210 has a matching device ID and target device ID), the read command to the addressed register is only performed by the targeted buffer component 210. This read command causes the targeted buffer component 210 to load the contents of the addressed register into a serializer (i.e., shift register).

To obtain the contents of the addressed register, side-channel 235 is used to cause the RCD 230 to perform a series of BC writes that cause the addressed buffer component 210 to shift out the contents of the addressed register on an error signal connection, ER. In an embodiment, the error signal connection, ER, is also connected to memory components 240. Thus, control connections 208 can be used to prevent the assertion of ER by a memory component 240. The assertion of ER by a memory component 240 can be prevented by disabling error checking by memory components 240.

First, side-channel 235 is used to cause RCD 230 to issue a first write command via the BC bus. This first write command can correspond to a write command that shifts out the first bit of the serializer. A write command that corresponds to the first bit (as opposed to write command for the rest of the bits in the serializer) clears any counters and/or pointers used by the serializer to keep track of the current (and also therefore next) bit to be shifted out.

The side-channel 235 caused write command is only performed by the targeted buffer component 210. The targeted buffer component, in response, outputs the first bit of the addressed register on an error signal pin (ER) that is received by RCD 230. Side-channel 235 is used to read the value of the ER signal input to RCD 230. The value of the ER signal input to RCD 230 may be read from receiver circuit of RCD 230. The value of the ER signal input to RCD 230 may be read from an internal register of RCD 230 that gets modified (i.e., one or more bits that get set or reset) by an asserted ER signal.

To obtain the rest of the contents of the addressed register, side-channel 235 is used to cause the RCD 230 to perform a series of BC writes that cause the addressed buffer component 210 to shift out the contents of the addressed register and/or update (i.e., increment/decrement) any counters and/or pointers used by the serializer (e.g., a 'send next bit' command.) The targeted buffer component, in response, successively outputs the next bit of the addressed register on the error signal pin (ER) that is received by RCD 230. After each BC write, side-channel 235 is used to read the values of the ER signal input to RCD 230 (which correspond to the contents of the addressed register.)

When the host is finished reading/writing any registers in buffer components 210, a write command on BC is used to restore buffer components 210 to normal operation (i.e., exit the in-system register access mode.) Module 200 may then be operated using any new/modified register values. These new/modified register values may help debug problems with module 200 (e.g., a malfunctioning memory component 240 or malfunctioning buffer component 210).

It should be understood that while module 200 is described herein as being compatible with DDR4 LRDIMM, the functions and structures described may be implemented on modules that are not compatible with DDR4 LRDIMM, such as custom modules, non-standard modules, and/or future standardized modules, etc. For example, the functions and structures described herein may be implemented on modules that do not have a dedicated ER signal in normal operation. In another example, the functions and structures described herein may be implemented on modules that have a dedicated ER signal connected to more components (e.g., additional IC's on module 200—such as a processor, or additional ranks of memory devices), or fewer components (e.g., only memory components 240) than described herein with respect to module 200.

Figure 3:
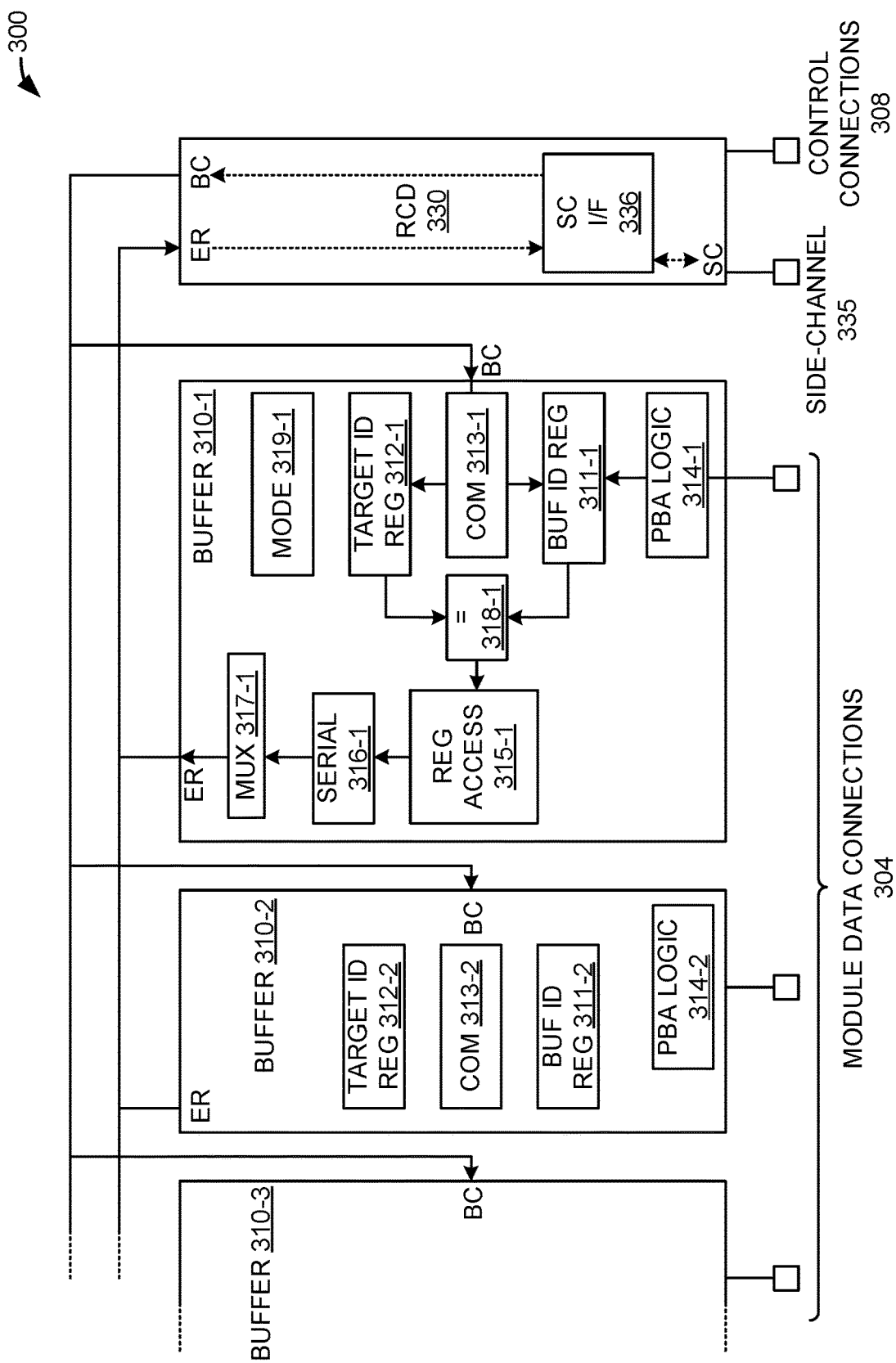
FIG. 3 illustrates side-channel access to the registers of buffers on a memory module.

FIG. 3 illustrates side-channel access to the registers of buffers on a memory module. In FIG. 3, module 300 comprises memory device (not shown in FIG. 3), buffer 310-1, buffer 310-2, buffer 310-3 (collectively buffers 310), RCD 330, module data connections 304, and side-channel connections 335. Buffers 310 and RCD 330 may correspond to buffers and/or RCDs on module 100, module 200, and/or module 300. RCD 330 is operatively coupled to send commands to buffers 310 via a common (among buffers 310), and unidirectional, module control bus, BC. RCD 330 can receive information from buffers 310 via a common (among buffers 310), and unidirectional, error signal, ER. Each of buffers 310 is also operatively coupled to one or more (e.g., x4) module data connections 304.

RCD 330 includes side-channel interface 335. Side-channel interface 336 is operatively coupled to side-channel connections 335. Side-channel interface 336 is operatively coupled (within RCD 330) to module control bus, BC, and error signal, ER. Thus, it should be understood that side-channel interface 336 can, at least, be used to control BC (e.g., to issue buffer commands) and to read the status (i.e., value) of ER.

Buffers 310 each include a buffer ID register 311, a target ID register 312, command interface 313, per-buffer access (PBA) logic 314, register access logic 315, serializing logic 316, multiplexer (MUX) 317, and equality compare logic 318. Each command interface 313 is operatively coupled to BC to receive commands from RCD 330 (as controlled by side-channel interface 336, in particular.)

In FIG. 3, buffer 310-1 is illustrated as having buffer ID register 311-1, target ID register 312-1, command interface 313-1, PBA logic 314-1, register access logic 315-1, serializing logic 316-1, multiplexer (MUX) 317-1, and equality compare logic 318-1. For the sake of brevity, buffer 310-2 is illustrated as having buffer ID register 311-2, target ID register 312-2, command interface 313-2, and PBA logic 314-2. Buffer 310-3 is illustrated without internal components. However, it should be understood that all of the buffers 310 on module 300 include at least a buffer ID register 311, a target ID register 312, command interface 313, per-buffer access (PBA) logic 314, register access logic 315, serializing logic 316, and multiplexer (MUX) 317 and are typically identical devices.

Each command interface 313 is operatively coupled to buffer ID register 311. Each PBA logic 314 is operatively coupled to one or more module data connections 304 to receive per-buffer selection signals that allow individual buffers 310 to be accessed during initialization of the host (not shown in FIG. 3). In particular, each PBA logic 314 is operatively coupled to one or more module data connection 304 to receive per-buffer selection signals that allow each buffer ID register 311 to be configured (via command interface 313) with a unique (at least among buffers 310) device ID value during initialization. PBA operations directed to one or more of buffers 310 can be controlled via control connections 308.

Each command interface 313 is also operatively coupled to target ID register 312. Each command interface 313 is operatively coupled to a respective target ID register 312 so that a BC write command can be used to set the target ID register 312 with the ID number corresponding to the one of buffers 310 that is to respond to in-system register access commands received via BC.

Each target ID register 312 and each buffer ID register 311 are operatively coupled to equality comparator 318. When a buffer 310 is in the in-system access mode, equality comparator 318 determines whether the target ID value stored in target ID register 312 is equal to the buffer ID value stored in buffer ID register 311. When the buffer ID value stored in buffer ID register 311 is equal to the target ID value stored in target ID register 312 (and the buffer 310 is in in-system access mode), register access logic 315 is enabled for that buffer 310. When the buffer ID value stored in buffer ID register 311 is not equal to the target ID value stored in target ID register 312, register access logic 315 is disabled for that buffer 310.

Register access logic 315 is operatively coupled to serializing logic 316. Register access logic 315 provides, when enabled and commanded, the contents of a register internal to a buffer 310 to serializing logic 316. Serializing logic 316 is operatively coupled to MUX 317. MUX 317 is operatively coupled to error signal ER. When buffer 310 is in in-system access mode, MUX 317 is configured by mode logic 319 to provide ER with the output of serializing logic 316. When buffer 310 is in normal operating (or initialization) mode, MUX 317 is configured by mode logic 319 to provide error signal ER with an indicator of whether buffer 310 has detected an error.

To access registers internal to buffer components 310 via side-channel connections 335, side-channel commands are received in RCD 330 via side-channel interface 336. These side-channel commands place RCD 330 and buffers 310 in an in-system access mode. This in-system access mode allows side-channel 335 to access registers in an individually addressed buffer component 310.

To individually access a buffer component 310, the buffer ID register 311 of each buffer 310 is configured with a unique (at least among buffer components 310) device ID value. Each buffer component 310 may be configured with a unique device ID value during the initialization (i.e., not normal operation) of module 300 using buffer select signals received via module data connections 304. Once the host has configured each buffer component 310 with unique buffer ID values, the system can finish initializing module 300 (and the rest of the system) and start normal operation.

After initialization (and when buffers 310 are configured into in-system access mode), individual registers of individual buffer components 310 can be accessed using side-channel 335. To access (i.e., read or write) a register using side-channel 335, side-channel interface 336 is used to place RCD 330 and buffer components 310 in the in-system register access mode. Side-channel 335 is used to control BC to send a write command on BC that places buffer components 310 in the in-system register access mode. In an embodiment, the write command that places buffer components 310 in the in-system register access mode can be performed regardless of whether a particular device ID value matches the target ID value.

Once side-channel 335 is used to place RCD 330 and buffer components 310 in the in-system register access mode, side-channel 335 may be used to cause RCD 330 to set a target device ID value in register 312 of all buffer components 310 using a write command on buffer control bus BC. Side-channel 335 may also be used to issue a write command that is addressed to the desired register. Since only one buffer 310-1 is enabled by equality comparator 318 to respond to the write command (because only one buffer 310 has a matching device ID value and target device ID value), the write command to the addressed register is only performed by the targeted buffer 310 (e.g., buffer 310-1). The rest (e.g., not targeted buffers 310-2 and 310-3) of the buffers do not perform the write command because and equality comparator 318 has not enabled register access logic 315. Therefore the addressed register is not affected in the buffer components 310 (e.g., buffers 310-2 and 310-3) that were not the target of the write command.

Side-channel 335 may be used to issue a read command that is addressed to the desired register. Since only one buffer 310-1 is enabled to respond to the read command, the read command to the addressed register is only performed by register access logic 315-1 in the targeted buffer 310-1.

This read command causes register access logic 315-1 to load the contents of the addressed register into a serializing logic 316-1.

Side-channel 335 may be used to perform a series of BC writes that cause serializing logic 316-1 to send out the contents of the addressed register on an error signal connection, ER, one bit at a time. Side-channel 335 is used to issue these write commands via the BC bus. As discussed herein, the issued write command is only performed by the targeted buffer 310-1. The targeted buffer 310-1 (and serializing logic 316-1 and MUX 317-1, in particular), in response, output a bit of the addressed register on an error signal pin (ER). The error signal therefore reflects the bit of the register that was output by serializing logic 316-1. Side-channel 335 can be used to read the value of the ER signal input to RCD 330. This process may be repeated to obtain the rest of the contents of the addressed register via side-channel 335.

When the host is finished reading/writing any registers in buffer components 310, a write command on BC may be used to restore buffer components 310 to normal operation (i.e., exit the in-system register access mode.) Module 300 may then be operated using the new/modified register values. These new/modified register values may help debug problems with module 300 (e.g., a malfunctioning memory component or malfunctioning buffer 310).

FIGS. 4A-4D illustrate operations for in-system register access. In FIGS. 4A-4D, module 400 comprises, control connections 408, module data connections 404, RCD 430, buffer 410-1, buffer 410-2, and buffer 410-3. Buffers 410-1, 410-2, and 410-3 may be collectively referred to as buffers 410. Buffers 410 and RCD 430 may correspond to buffers and/or RCDs on module 100, module 200, and/or module 300.

Figure 4A:
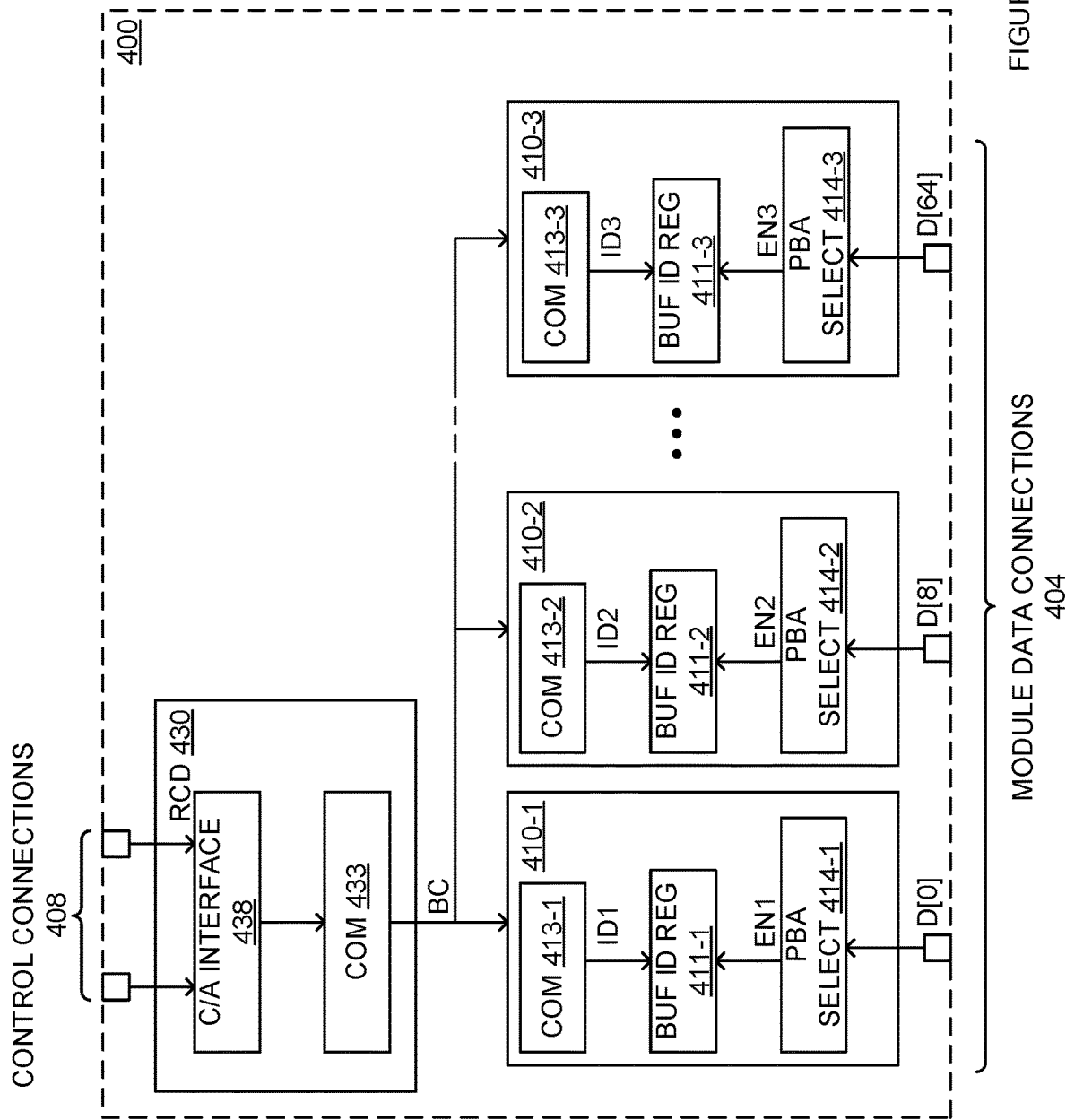
FIG. 4A illustrates setting an identification register value on a buffer.

FIG. 4A illustrates setting an identification register value on a buffer. In FIG. 4A, RCD 430 is operatively coupled to control connections 408. Buffer 410-1 is operatively coupled to D[0] of module data connections 404. Buffer 410-2 is operatively coupled to D[8] of module data connections 404. Buffer 410-3 is operatively coupled to D[64] of module data connections 404.

A command to write the buffer ID register of a buffer 410 is received by module 400 via control connections 408. The command to write the buffer ID register is received by command/address (C/A) interface 438 of RCD 430. RCD 430 interprets and relays the command to write the buffer ID register to module control bus interface 433. The interpreted and relayed command to write the buffer ID register is sent to each of buffers 410 via module control bus, BC. Each of buffers 410 receives the command write the buffer ID register 411 via command interface 413. However, the command write the buffer ID register 411 is only performed by the buffer(s) 410 that have determined that they are selected. PBA select logic 414 determines whether a particular buffer is coupled to an asserted module data connection 404 and is therefore selected to perform the corresponding operation received from RCD 430. Thus, to have buffer 410-1 write to its buffer ID register, module data connection D[0] is asserted; to have buffer 410-1 write to its buffer ID register, module data connection D[8] is asserted; and so on.

In FIG. 4A, the value ID1 is written (as described herein) to buffer ID 411-1 register of buffer 410-1. The value ID2 is written to buffer ID register 411-2 of buffer 410-2. The value ID3 is written (as described herein) to buffer ID register 411-3 of buffer 410-3. When all of the buffer ID registers have been written, each buffer 410 is configured with a unique (at least among buffers 410) device ID value that will allow later per-buffer operations to be performed on an individual buffer 410 basis.

Figure 4B:
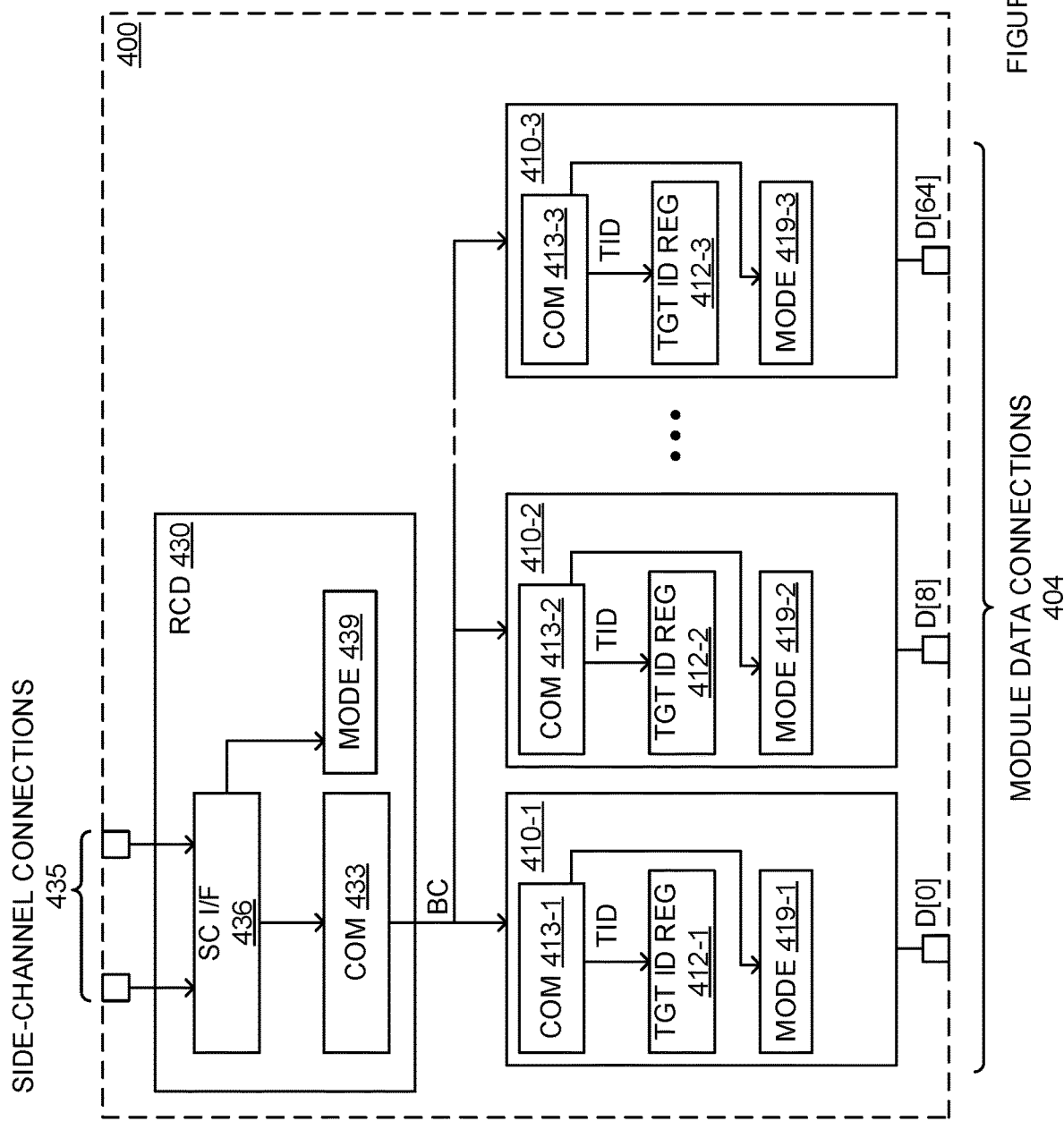
FIG. 4B illustrates setting a target identification value for the buffers on a module.

FIG. 4B illustrates setting a target identification value for the buffers on a module. In FIG. 4B, RCD 430 is operatively coupled to side-channel connections 435. Side-channel 435 controls RCD 430 via side-channel interface 436. Side-channel interface 436 is used to set mode circuitry 439 of RCD 430 in an in-system access mode. Side-channel interface 436 is also used to control module control bus interface 433.

Side-channel connections 435 control module control bus interface 433 to issue write commands to buffers 410 via BC. A first write command sets mode circuitry 419 of buffers 410 into an in-system access mode. A second write command sets a target device ID value into the target ID registers 412 of buffers 410. Each of the target ID registers 412 are set to the same target device ID value by side-channel 435.

Figure 4C:
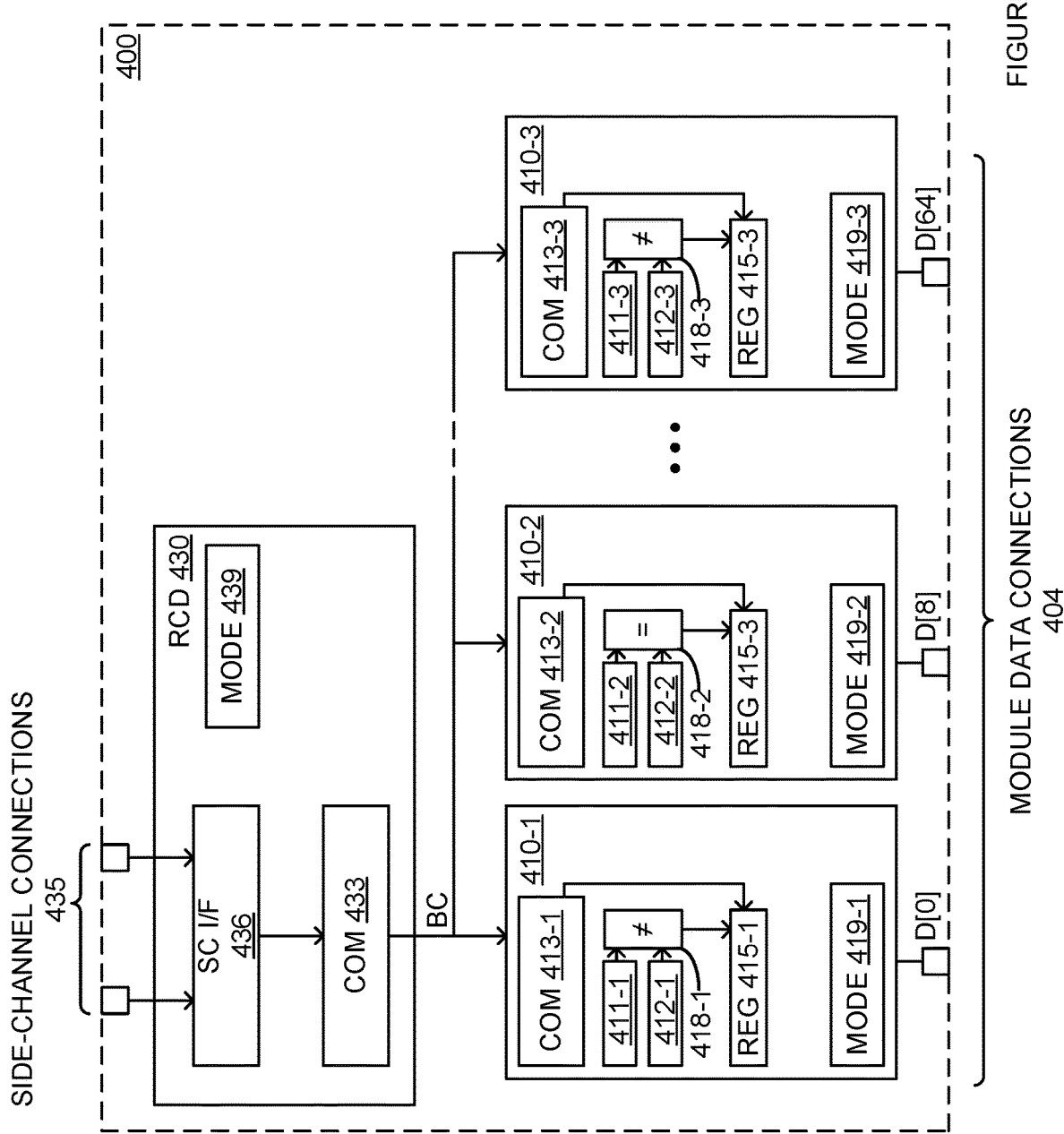
FIG. 4C illustrates a side-channel write to a register on a single buffer.

FIG. 4C illustrates a side-channel write to a register on a single buffer. In FIG. 4C, RCD 430 and buffers 410 are already configured into the in-system access mode as indicated by the state of mode circuitry 439 and mode circuitry 419, respectively. Also, each buffer 410 has been configured with a unique device ID and a target device ID number. The target device ID does not match the device ID of buffers 410-1 and 410-3. The target device ID matches the device ID of buffer 410-2. Thus, buffer 410-2 is the only buffer selected to perform any commands received via BC.

Side-channel connections 435 control RCD 430 (via control bus interface 433) to issue a write command to all of buffers 410. However, buffers 410-1 and 410-3 will not perform this write command because the device ID's stored in device ID register 411-1 and 411-3 do not match the target ID stored in target ID registers 412-1 and 412-3, respectively. This is illustrated in FIG. 4C by the 'not equal' sign in equality comparators 418-1 and 418-3, respectively.

Buffer 410-2 will perform the write command to the addressed register (e.g., register 413-2) because the device ID stored in device ID register 411-2 matches the target ID stored in target ID registers 412-2. Thus, buffer 410-2 is the only buffer 410 to perform the write command that was issued under the control of side-channel 435. This is illustrated in FIG. 4C by the 'equal' sign in equality comparator 418-2.

Figure 4D:
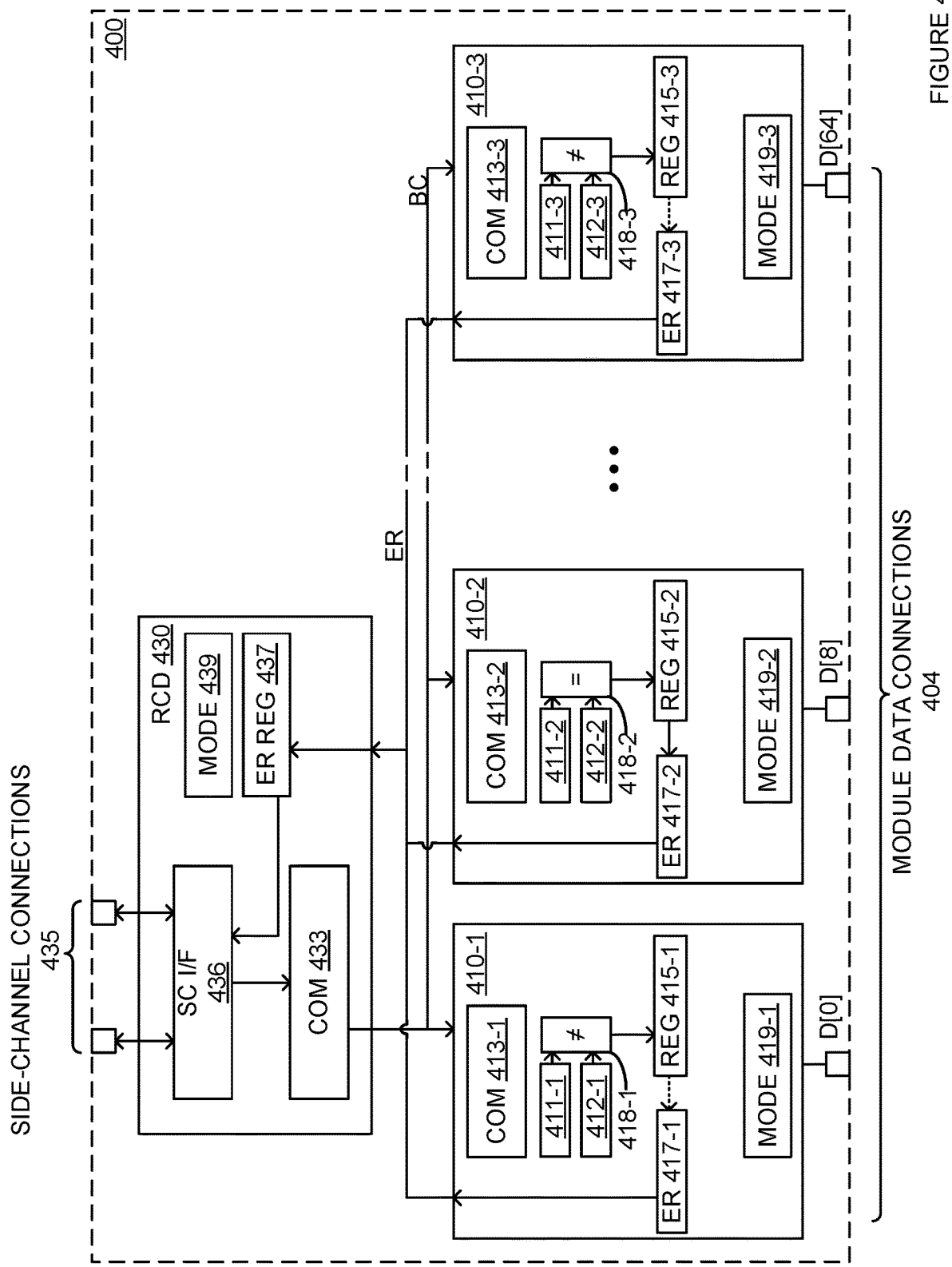
FIG. 4D illustrates a side-channel read of a register on a single buffer.

FIG. 4D illustrates a side-channel read of a register on a single buffer. In FIG. 4D, RCD 430 and buffers 410 are already configured into the in-system access mode as indicated by the state of mode circuitry 439 and mode circuitry 419, respectively. Also, each buffer 410 has been configured with a unique device ID and a target device ID number. The target device ID does not match the device ID of buffers 410-1 and 410-3. The target device ID matches the device ID of buffer 410-2. Thus, buffer 410-2 is the only buffer selected to perform any commands received via BC.

Side-channel connections 435 control RCD 430 to issue a read command to all of buffers 410. However, buffers 410-1 and 410-3 will not perform this read command because the device ID's stored in device ID register 411-1 and 411-3 do not match the target ID stored in target ID registers 412-1 and 412-3, respectively. This is illustrated in FIG. 4D by the 'not equal' sign in equality comparators 418-1 and 418-3, respectively.

Buffer 410-2 will perform the read command to the addressed register (e.g., register 413-2) because the device ID stored in device ID register 411-2 matches the target ID stored in target ID registers 412-2. This is illustrated in FIG. 4D by the 'equal' sign in equality comparator 418-2. The read command to the addressed register 415-2 causes the contents of the addressed register to be provided serially to ER signal driver 417-2.

ER signal driver 417 in each buffer may be compatible with an 'open-drain' or 'wired-OR' signaling arrangement that shares the signal ER among all of the buffers 410. However, since the device ID stored in device ID register 411 only matches the target ID stored in target ID registers 412 for buffer 410-2, only ER signal driver 417-2 will place the addressed register contents onto the ER signal. Side-channel connections 435 may need to control RCD 430 (via control bus interface 433) to issue additional read and/or write commands to all of buffers 410 in order to cause the ER signal to sequentially output the bits of the addressed register.

Figure 5:
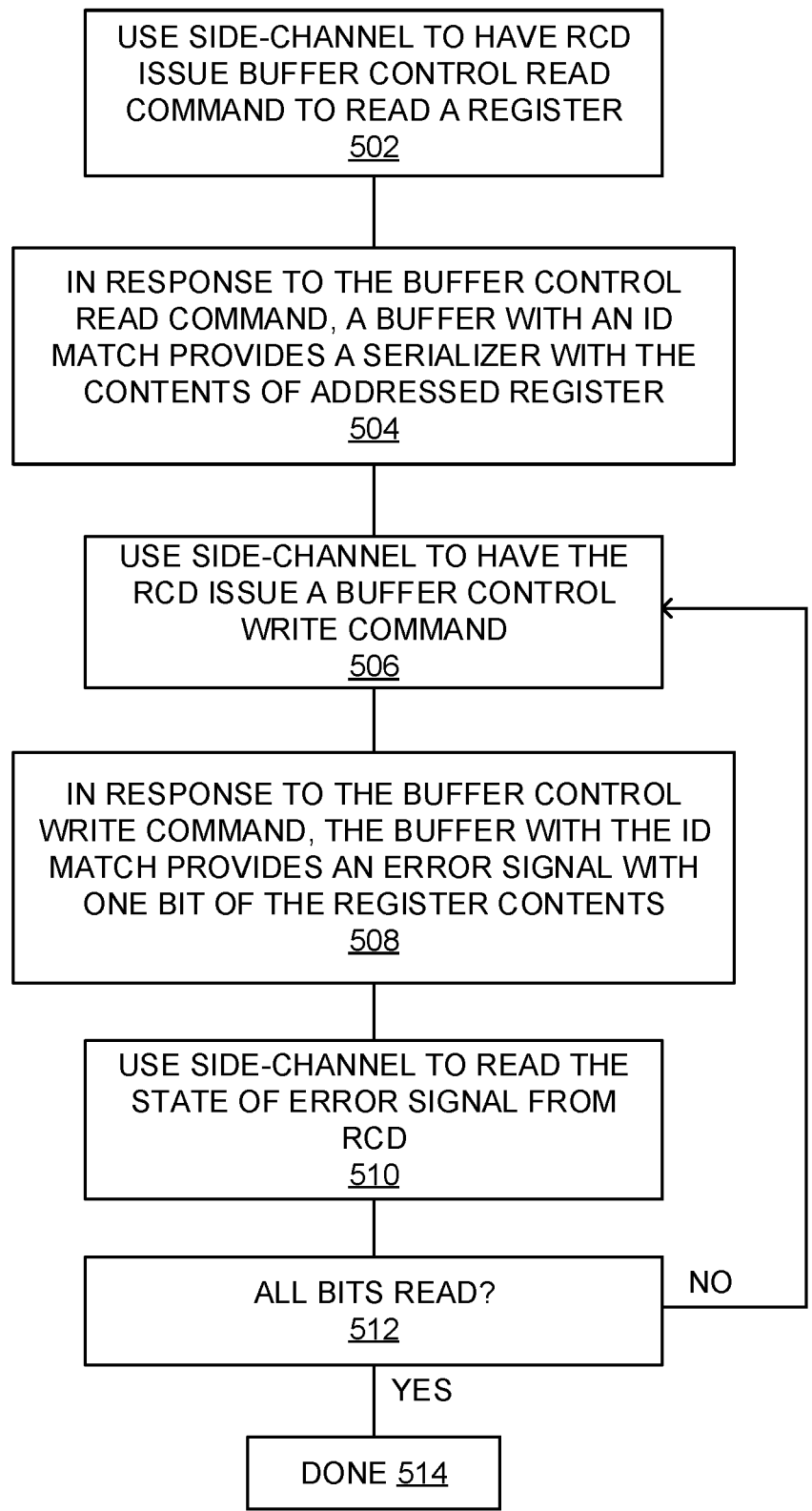
FIG. 5 is a flowchart illustrating a side-channel read of buffer register contents.

FIG. 5 is a flowchart illustrating a side-channel read of buffer register contents. The steps illustrated in FIG. 5 may be performed by one or more elements of module 100, module 200, module 300, and/or module 300. A side-channel is used to have an RCD issue buffer control read command to read a register (502). For example, side-channel 335 may be used to cause RCD 330 to issue a register read command via control bus BC.

In response to the buffer control read command, a buffer with an ID match provides a serializer with the contents of addressed register (504). For example, buffer 310-1 may respond to the buffer read command based on a match between the contents of target ID register 312-1 and buffer ID register 311-1. Buffer 310-1 may respond to the buffer read command by providing the contents of the addressed register to serializer 316-1.

The side-channel is used to have the RCD issue a buffer control write command (506). For example, side-channel 335 may be used to cause RCD 330 to issue a write command via control bus BC. In response to the buffer control write command, the buffer with the ID match provides an error signal with one bit of the register contents (508). For example, in response to the buffer write command received from RCD 330 on BC, buffer 310-1 may drive the output of serializer 316 onto error signal ER.

The side-channel is used to read the state of the error signal from the RCD (510). For example, side-channel 335 may be used to read the state of error signal ER at a pin of RCD 330. In another example, side-channel 335 may be used to read the state of a register (e.g., error condition register) in RCD 330 that reflects whether ER is (or has been) asserted.

Box 512 is a decision box. If all the bits of the addressed register have been read, flow proceeds to box 514 from box 512 and the process terminates in box 514. If all the bits of the addressed register have not been read, flow proceeds to box 506 from box 512. For example, if all of the bits have not been read, the process of issuing write commands to shift new bits out of serializer 316 and reading the state of ER from RCD 330 to obtain the new bits is repeated until all of the bits of the register have been read using side-channel 335.

Figure 6:
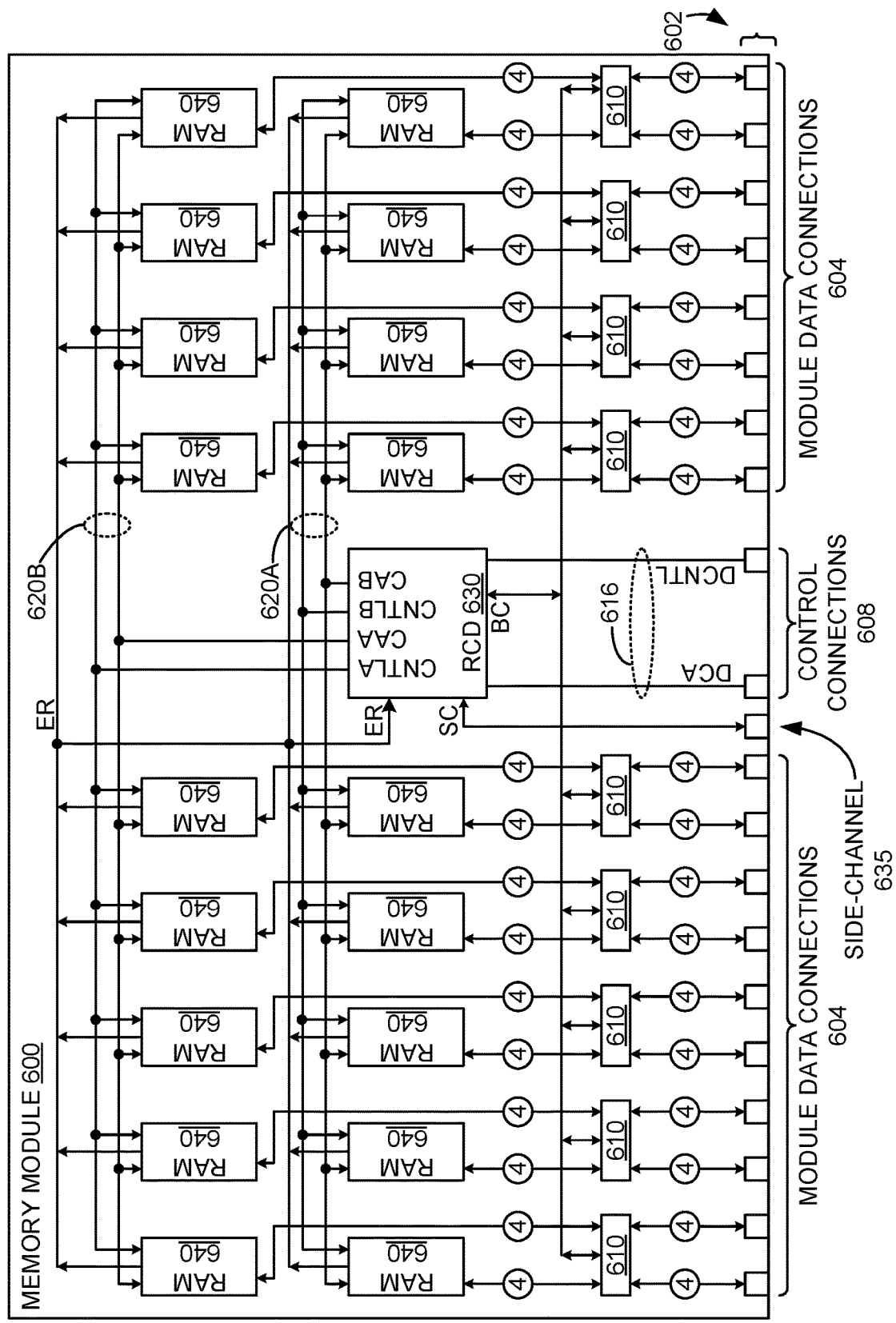
FIG. 6 illustrates a multi-data width load reduced memory module with bidirectional buffer access via a module side-channel.

FIG. 6 illustrates a multi-data width memory module with bidirectional buffer access via a module side-channel. Module 600 is similar to module 200, except that module control bus BC is bidirectional, and the ER signal is not used to return the result of buffer register reads to the RCD. Instead, the buffer 610 having a match between the target device ID and the device ID uses the reverse (i.e., from buffer to RCD) direction of BC to return results to RCD 630. Once the results of a buffer read are returned to RCD 630 (or received at one or more BC pins of RCD 630), side-channel 635 may be used by the host (or another debugging system) to read the results of the register read command. Similar to module 200, before placing RCD 630 and/or buffer components 610 in the in-system register access mode, error checking should be disabled in memory components 640. This prevents a memory component 640 from asserting an error on the ER signal that may interfere with the operation of the in-system register access mode or other operations of the host system. In addition RCD 630 can, at least while in the in-system register access mode, be configured to prevent the signaling of errors to the host system.

Disabling the propagation of the ER signal outside of RCD 630 and/or module 600 helps allow the usage of the ER signal for the data channel between the memory components 640 and RCD 630. The ER signal is typically coupled to a system-side ALERT signal (e.g., one of control connections 608.) The system-side ALERT signal should be disabled during in-system register access mode so that data transfers between memory components 640 and RCD 630 do not cause the system-side ALERT to be asserted to the system via control connections 608.

Figure 7:
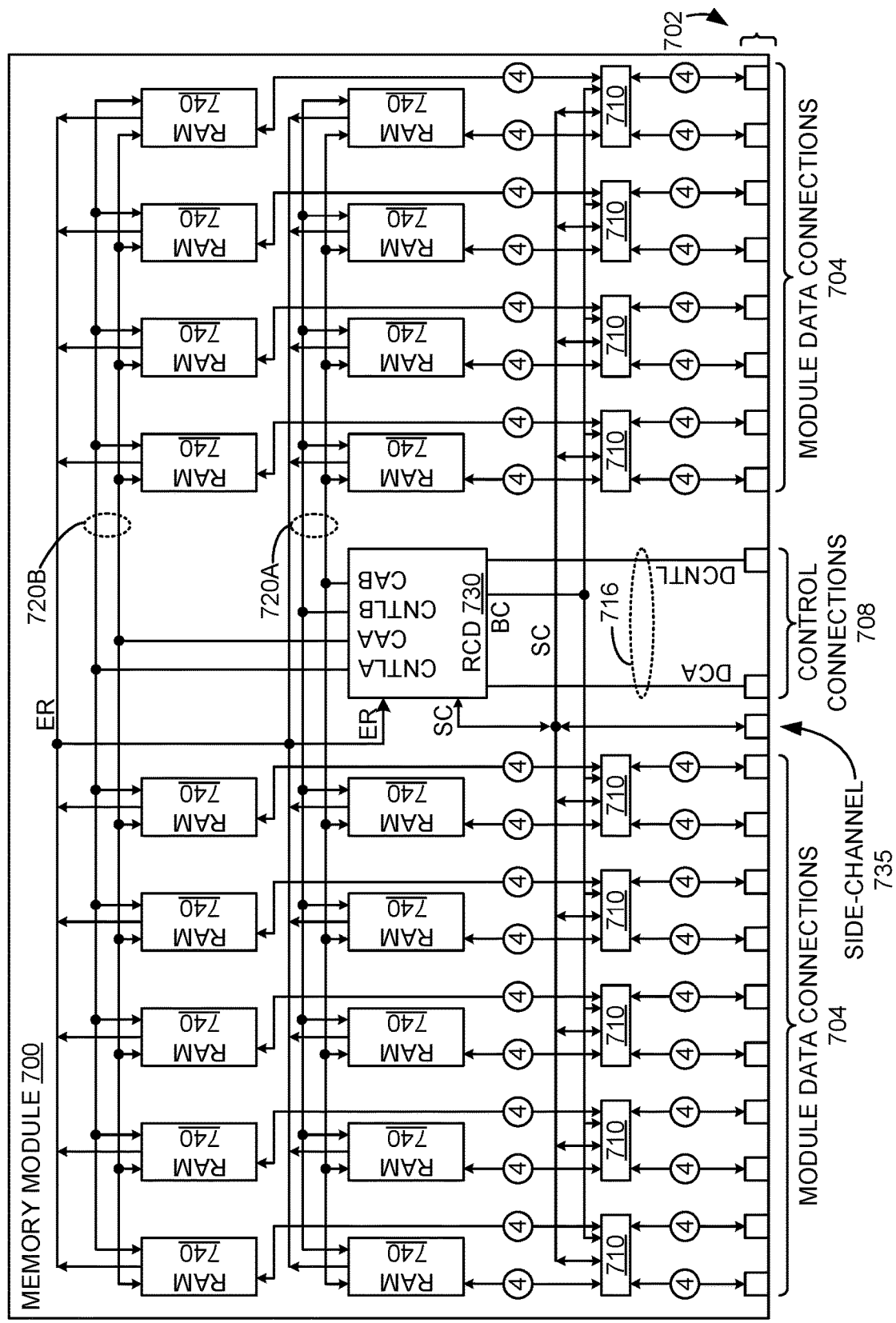
FIG. 7 illustrates a multi-data width memory module with bidirectional buffer access via a shared side-channel.

FIG. 7 illustrates a multi-data width memory module with bidirectional buffer access via a shared side-channel. Module 700 is similar to module 200, except that: (1) buffers 710 are also connected to side channel 735; (2) RCD 730 does not need to issue read and write commands to buffers 710; (3) side-channel 735 can be used to directly to address, read, and write the registers of buffers 710; and, (4) the ER signal is not used to return the result of buffer register reads to the RCD. Accordingly, side-channel 735 may be used by the host (or another debugging system) to read/write the registers of RCD 730 and to read/write each individual buffer 710. Similar to module 200, before placing RCD 730 and/or buffer components 710 in the in-system register access mode, error checking should be disabled in memory components 740. This prevents a memory component 740 from asserting an error on the ER signal that may interfere with the operation of the in-system register access mode, or other operations of the host system. In addition RCD 730 can, at least while in the in-system register access mode, be configured to prevent the signaling of errors to the host system.

Disabling the propagation of the ER signal outside of RCD 730 and/or module 700 helps allow the usage of the ER signal for the data channel between the memory components 740 and RCD 730. The ER signal is typically coupled to a system-side ALERT signal (e.g., one of control connections 708.) The system-side ALERT signal should be disabled during in-system register access mode so that data transfers between memory components 740 and RCD 730 do not cause the system-side ALERT to be asserted to the system via control connections 708.

Figure 8:
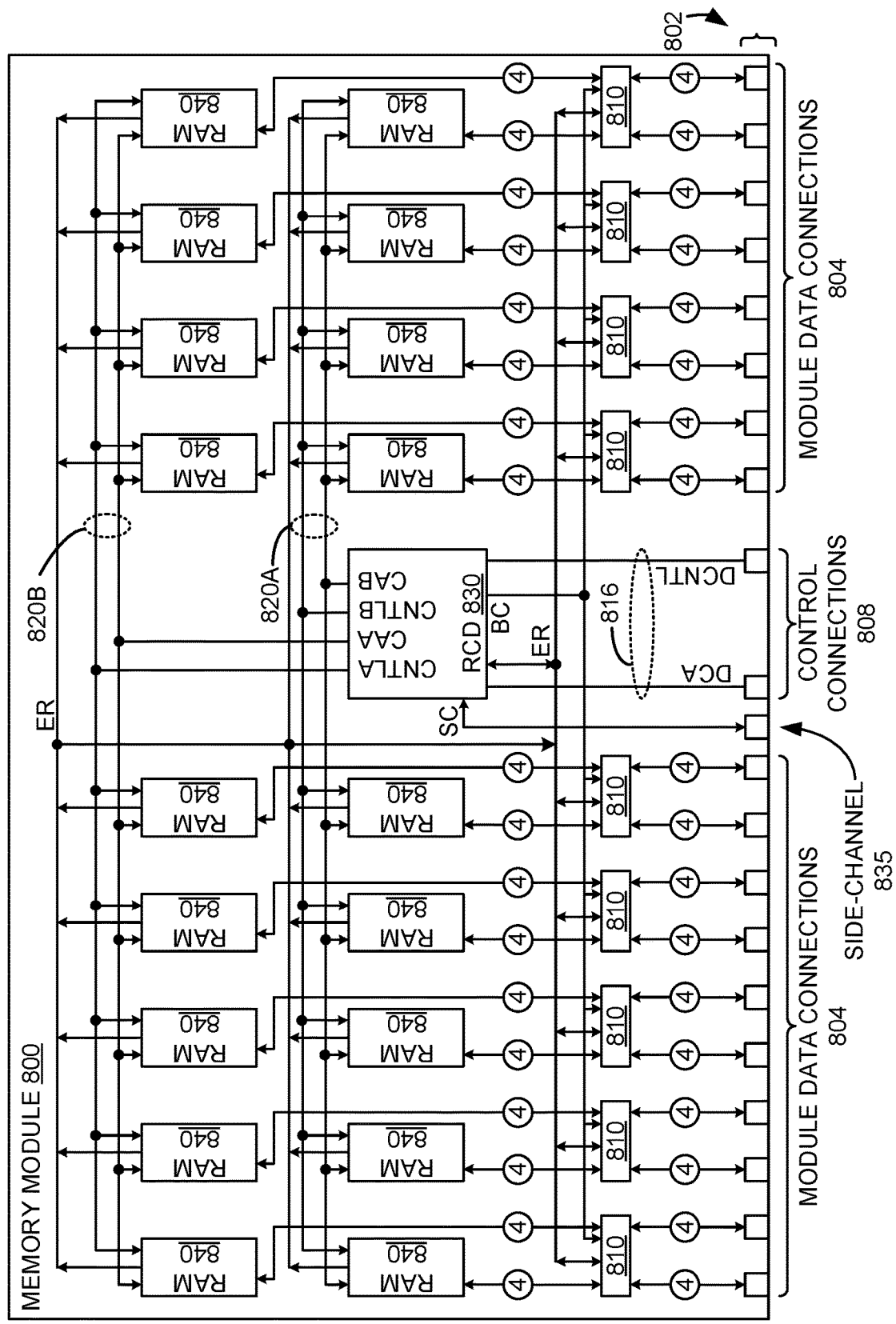
FIG. 8 illustrates a multi-data width memory module with bidirectional buffer access using a bidirectional error signal.

FIG. 8 illustrates a multi-data width memory module with bidirectional buffer access using a bidirectional error signal. Module 800 is similar to module 200, except that: (1) RCD 830 does not need to issue read and write commands to buffers 810; (3) a secondary side-channel using one or more BC signals (e.g., clock) and the bidirectional error signal, ER, can be used to directly to address, read, and write the registers of buffers 810. Accordingly, side-channel 835 can be used to control the secondary side-channel (which uses signal from BC and ER) may be used by the host (or another debugging system) to read/write the registers of RCD 830 and to read/write each individual buffer 810. For example, when buffers 810 and RCD 830 are in an in-system access mode, one signal from BC (e.g., a clock) may be used as an I2C SCL, and the bidirectional ER signal may be used as an I2C SDA. Other signals (e.g., from BC) may be bidirectional in the in-system access mode and used as an I2C SDA when one or more buffers 810 is placed in an in-system access mode. Similar to module 200, before placing RCD 830 and/or buffer components 810 in the in-system register access mode, error checking should be disabled in memory components 840. This prevents a memory component 840 from asserting an error on the ER signal that may interfere with the operation of the in-system register access mode, or other operations of the host system. In addition RCD 830 can, at least while in the in-system register access mode, be configured to prevent the signaling of errors to the host system.

Disabling the propagation of the ER signal outside of RCD 830 and/or module 800 helps allow the usage of the ER signal for the data channel between buffer components 810 or memory components 840, and RCD 830. The ER signal is typically coupled to a system-side ALERT signal (e.g., one of control connections 808.) The system-side ALERT signal should be disabled during in-system register access mode so that data transfers between buffer components 810 or memory components 840, and RCD 830, do not cause the system-side ALERT to be asserted to the system via control connections 808.

It should be understood that modules 600, 700, and 800 may be implemented on modules that differ from the exact configurations shown and described. These configurations may be custom modules, non-standard modules, and/or compatible with future standardized modules, etc. For example, the functions and structures described herein may be implemented on modules that do not have a dedicated ER signal in normal operation. In another example, the functions and structures described herein may be implemented on modules that have a dedicated ER signal connected to more components (e.g., additional IC's on a module 600, 700, and/or 800—such as a processor, or additional ranks of memory devices), or fewer components than described herein.

Figure 9:
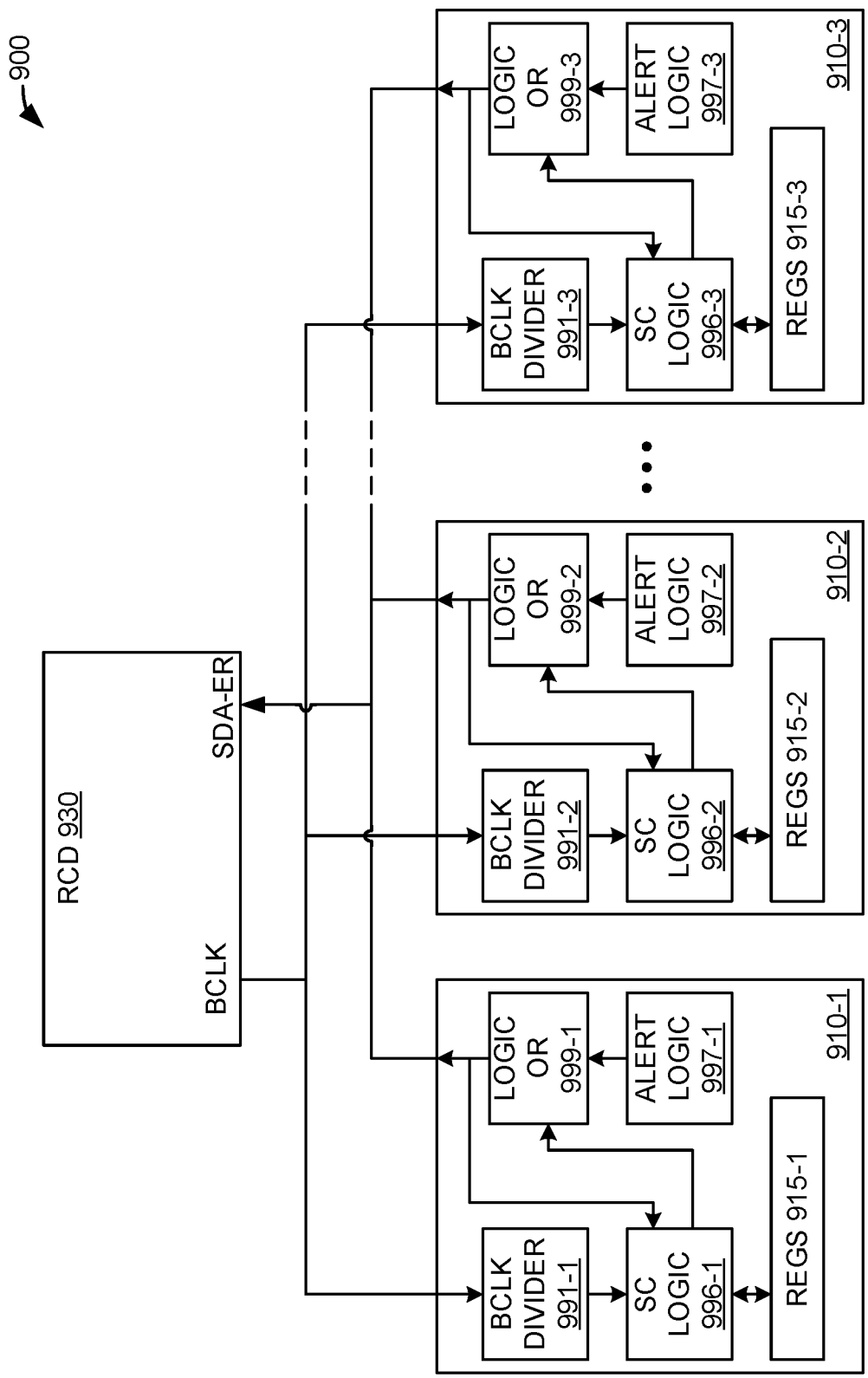
FIG. 9 illustrates a side-channel for register access using a dual-purpose error signal.

FIG. 9 illustrates a side-channel for register access using a dual-purpose error signal. In FIG. 9, module 900 comprises, RCD 930, buffer 910-1, buffer 910-2, and buffer 910-3 (collectively buffers 910). Buffers 910-1, 910-2, and 910-3 may be collectively referred to as buffers 910. Module 900 may correspond, for example, to module 1100 and/or module 1200.

RCD 930 is connected to each of buffers 910 via a common clock signal, BCLK. BCLK may be a clock signal that is also used as a timing reference for a buffer control interface between RCD 930 and buffers 910. RCD 930 is also connected to each of buffers 910 via a bidirectional common error/data signal, SDA-ER.

Buffers 910 each include a BLCK divider 991, side-channel logic 996, registers 915, alert logic 997, and a logical "OR" function 999. When in a normal mode of operation, BCLK provides a timing reference for commands that are sent from RCD 930 to buffers 910. SDA-ER functions as a common error reporting signal for buffers 910 to report an error condition(s) to RCD 930. These error conditions may be detected by alert logic 997.

When in an in-system access mode, BCLK divider 991 can divide down (or multiply up) the frequency of BLCK to meet the requirements of side-channel logic 996 and/or RCD 930. These requirements can be, for example, the maximum and/or minimum frequency for a timing reference (e.g., clock signal such as SCLK) of a side-channel bus (e.g., I2C, SMBus) Side-channel logic 996 implements the protocols and other functions of the side-channel necessary to provide read and write access to registers 915. For example, side-channel logic 996 may implement the I2C bus protocol and timing. Side-channel logic 996 may use the SDA-ER signal as the data signal for the I2C data signal SDA, and the divided BCLK as I2C clock signal SCLK.

In an embodiment, alert logic 997 may cause the SDA-ER signal to be held in a state (e.g., a logic '1' or logic '0') that violates one or more requirements of the implemented serial bus protocol. For example, to conform with the I2C protocol, the data signal SDA of an I2C bus needs to return to a high state to signal a stop bit. By holding SDA low for a long period of time (many I2C cycles) without a low-to-high transition to signal a stop bit, RCD can detect a protocol error. In this manner, a buffer 910 (an alert logic 997, in particular) may signal an error condition by causing a protocol error that is detected by RCD 930.

Figure 10:
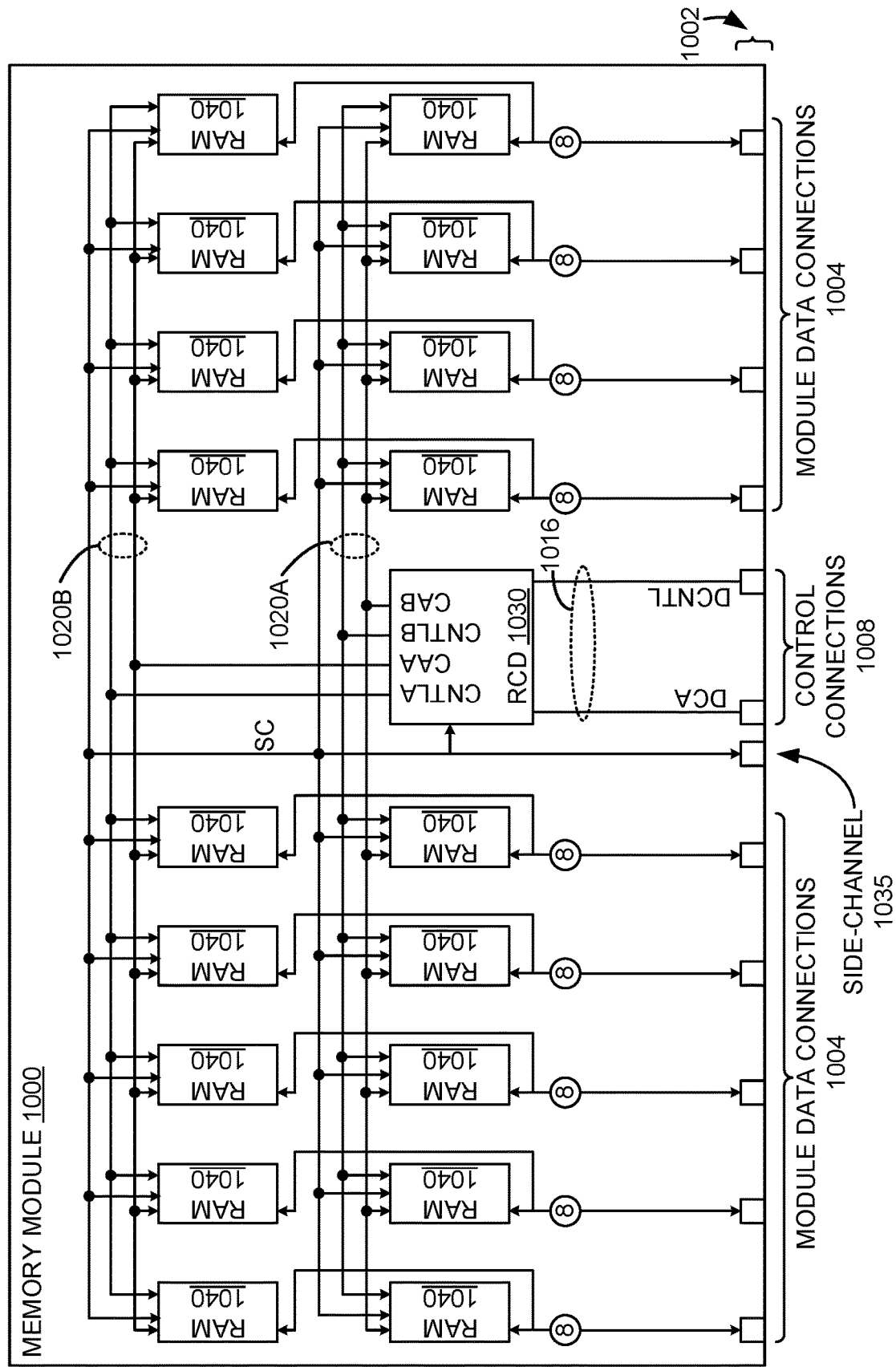
FIG. 10 illustrates a module with side-channel access to memory devices.

FIG. 10 illustrates a module with side-channel access to memory devices. In FIG. 10, module 1000 is configured to communicate nine eight-bit data bytes (72 data bits) in parallel. Module 1000 includes, e.g., eighteen memory components 1040 on one or each side. Each memory component 1040 may include multiple memory (e.g., DRAM) die, or multiple die stacked packages. In some configurations, each component 1040 communicates a four-bit-wide (x4, or a "nibble") with module data connections 1004. In other configurations, each component 1040 communicates an eight-bit-wide (x8, or a "byte") with module data connections 1004. However, it should be understood that different data widths and different numbers of components and dies can be used in other embodiments. Though not shown in FIG. 10, each memory component 1040 also communicates a complementary pair of timing reference signals (e.g. strobe signals) that time the transmission and receipt of data signals.

A memory controller (not shown) directs command, address, and control signals on control connections 1008 (i.e., ports DCA and DCNTL) to control the flow of data to and from module 1000 via groups of data links to module data connections 1004. RCD 1030 selectively interprets and retransmits the control signals on a module control interface 1016 (i.e., signals DCA and DCNTL) from module control connections 1008 and communicates appropriate command, address, and control signals to a first set of memory components 1040 via a first memory-component control interface 1020A and to a second set of memory components via a second memory-component control interface 1020B. Addresses associated with the commands on primary port DCA identify target collections of memory cells (not shown) in components 1040, and chip-select signals on primary port DCNTL and associated with the commands allow RCD 1030 to select individual integrated-circuit memory dies, or "chips," for both access and power-state management. RCD 1030 acts as a signal buffer to reduce loading on module connector 1002. This reduced loading is in large part because RCD 1030 presents a single load to module connector 1002 in lieu of the multiple memory device dies each that RCD 1030 serves.

Memory components 1040 and RCD 1030 are also operatively coupled to side-channel 1035. Side-channel 1035 may be used to read and/or write registers in memory components 1040 and RCD 1030. Side-channel 1035 may be, for example, an I2C bus or SMBus.

Figure 11:
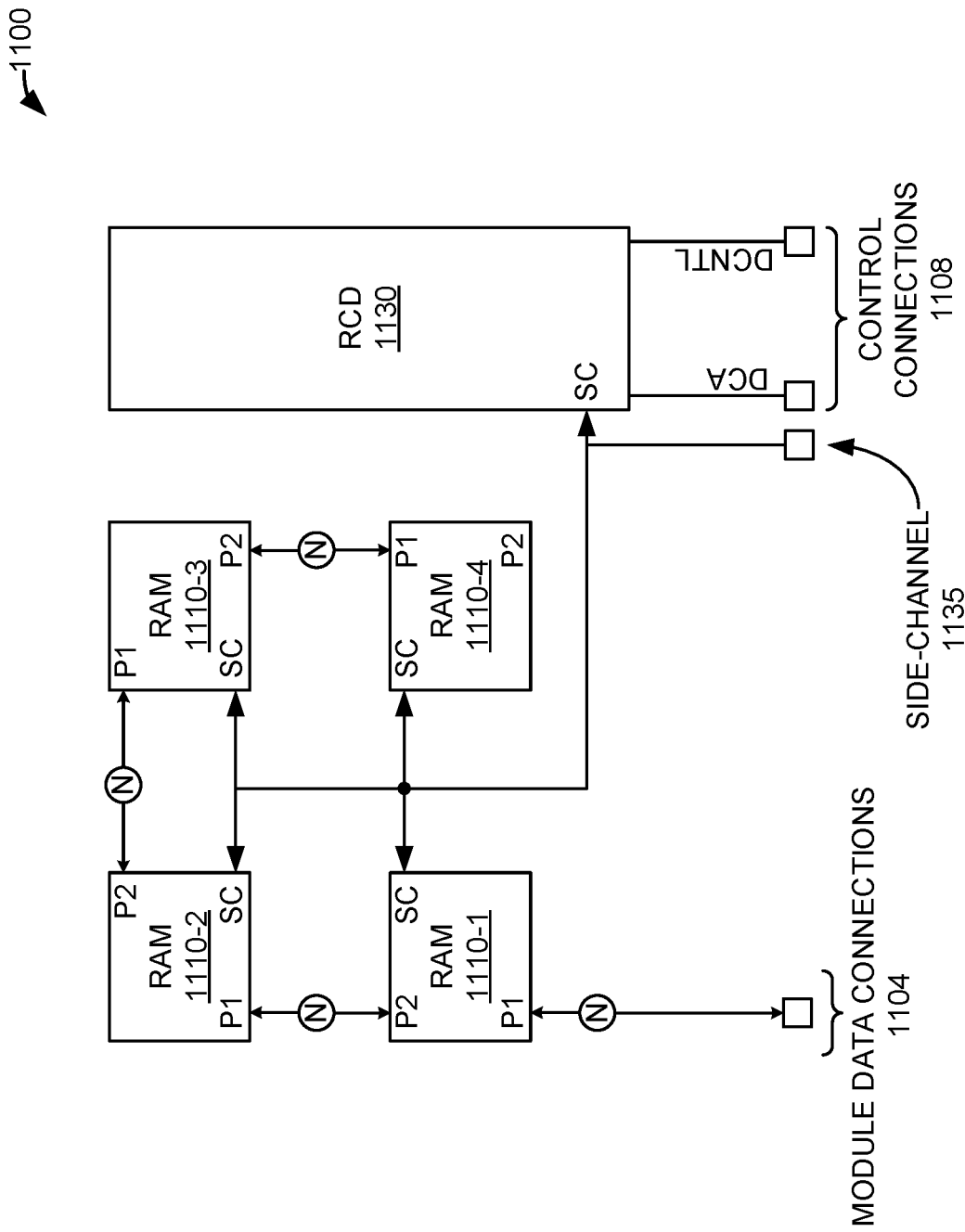
FIG. 11 illustrates shared side-channel access to memory devices configured to relay data.

FIG. 11 illustrates shared side-channel access to memory devices configured to relay data. In FIG. 11, module 1100 comprises memory component 1110-1, memory component 1110-2, memory component 1110-3, memory component 1110-4, and RCD 1135.

A memory controller (not shown) directs command, address, and control signals on control connections 1108 (i.e., ports DCA and DCNTL) to control the flow of data to and from module 1100 via groups of data links to module data connections 1104. RCD 1130 selectively interprets and retransmits the control signals on a module control interface from module control connections 1108 and communicates appropriate command, address, and control signals to memory components 1140.

Each memory component 1140 has at least two bidirectional data ports, P1 and P2, which are N-bits wide, where N is an integer (e.g., 4-bits or 8-bits.) Data can be relayed (or passed through) each memory component 1140 from port P1 to port P2, and vice versa. Data port P1 on memory component 1110-1 is connected to N number of module data connections 1104. Data port P2 on memory component 1110-1 is connected to data port P1 on memory component 1110-2. Data port P2 on memory component 1110-2 is connected to data port P1 on memory component 1110-3. Data port P2 on memory component 1110-3 is connected to data port P1 on memory component 1110-4. Thus, when RCD 1135 relays a command that accesses memory component 1110-4, the data may be relayed between module data connections 1104 and memory component 1110-4 via memory components 1110-1, 1110-2, and 1110-3. Thus, even though only one memory component 1110-1 is connected to module data connections 1104, module 1100 only presents a single load to module data connections 1104.

RCD 1135 and memory components 1110 are also connected to a common side-channel 1135. Side-channel 1135 may be used to read and/or write registers in memory components 1110 and RCD 1130. Side-channel 1135 may be, for example, an I2C bus or SMBus.

Figure 12:
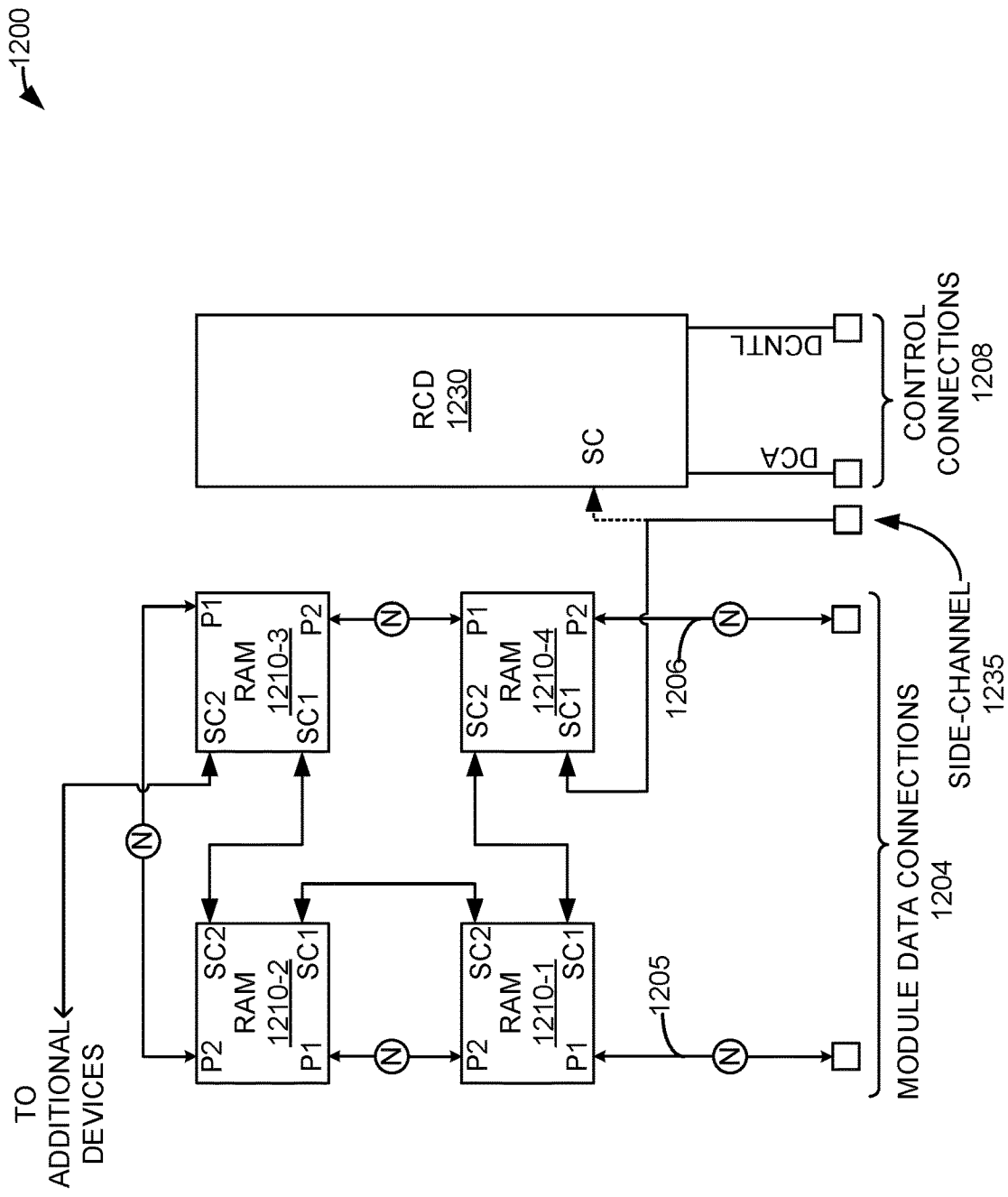
FIG. 12 illustrated a daisy-chained side channel access to memory devices configured to relay data.

FIG. 12 illustrated a daisy-chained side channel access to memory devices configured to relay data. In FIG. 12, module 1200 comprises memory component 1210-1, memory component 1210-2, memory component 1210-3, memory component 1210-4, and RCD 1230.

A memory controller (not shown) directs command, address, and control signals on control connections 1208 (i.e., ports DCA and DCNTL) to control the flow of data to and from module 1200 via groups of data links to module data connections 1204. RCD 1230 selectively interprets and retransmits the control signals on a module control interface from module control connections 1208 and communicates appropriate command, address, and control signals to memory components 1210.

Each memory component 1210 has at least two bidirectional data ports, P1 and P2, which are N-bits wide, where N is an integer (e.g., 4-bits or 8-bits.) Data can be relayed (or passed through) each memory component 1210 from port P1 to port P2, and vice versa. Data port P1 on memory component 1210-1 is connected to N number of module data connections 1204. Data port P2 on memory component 1210-1 is connected to data port P1 on memory component 1210-2. Data port P2 on memory component 1210-2 is connected to data port P1 on memory component 1210-3. Data port P2 on memory component 1210-3 is connected to data port P1 on memory component 1210-4. Thus, when RCD 1230 relays a command that accesses memory component 1210-4, the data may be relayed between module data connections 1204 and memory component 1210-4 via memory components 1210-1, 1210-2, and 1210-3. Thus, even though only one memory component 1210-1 is connected to module data connections 1204, module 1200 only presents a single load to module data connections 1204.

Side-channel 1235 may be used to read and/or write registers in memory components 1240 and (optionally) RCD 1230. Side-channel 1235 may be, for example, an I2C bus or SMBus. Each memory component 1210 has at least two bidirectional side-channel ports, SC1 and SC2. The control, data, and/or clock signal of side-channel 1235 can be relayed (or passed through) each memory component 1210 from port SC1 to port SC2, and vice versa. Side-channel 1235 is connected to side-channel port SC1 of memory component 1210-4. Side-channel port SC2 on memory component 1210-4 is connected to side-channel port SC1 on memory component 1210-1. Side-channel port SC2 on memory component 1210-1 is connected to side-channel port SC1 on memory component 1210-2. Side-channel port SC2 on memory component 1210-2 is connected to side-channel port SC1 on memory component 1210-3. Thus, when side-channel 1235 provides a command to access, for example, memory component 1210-3, the side-channel signals may be relayed between (or passed through) side-channel connections 1235 and memory component 1210-3 via memory components 1210-4, 1210-1, and 1210-2. Thus, even though only one memory component 1210-4 is connected to side-channel connections 1235, side-channel 1235 may be used to read and/or write registers in memory components 1210 and (optionally) RCD 1230.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of module 100, module 200, module 300, module 400, module 600, module 700, module 800, module 900, module 1000, module 1100, and/or module 1200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 13:
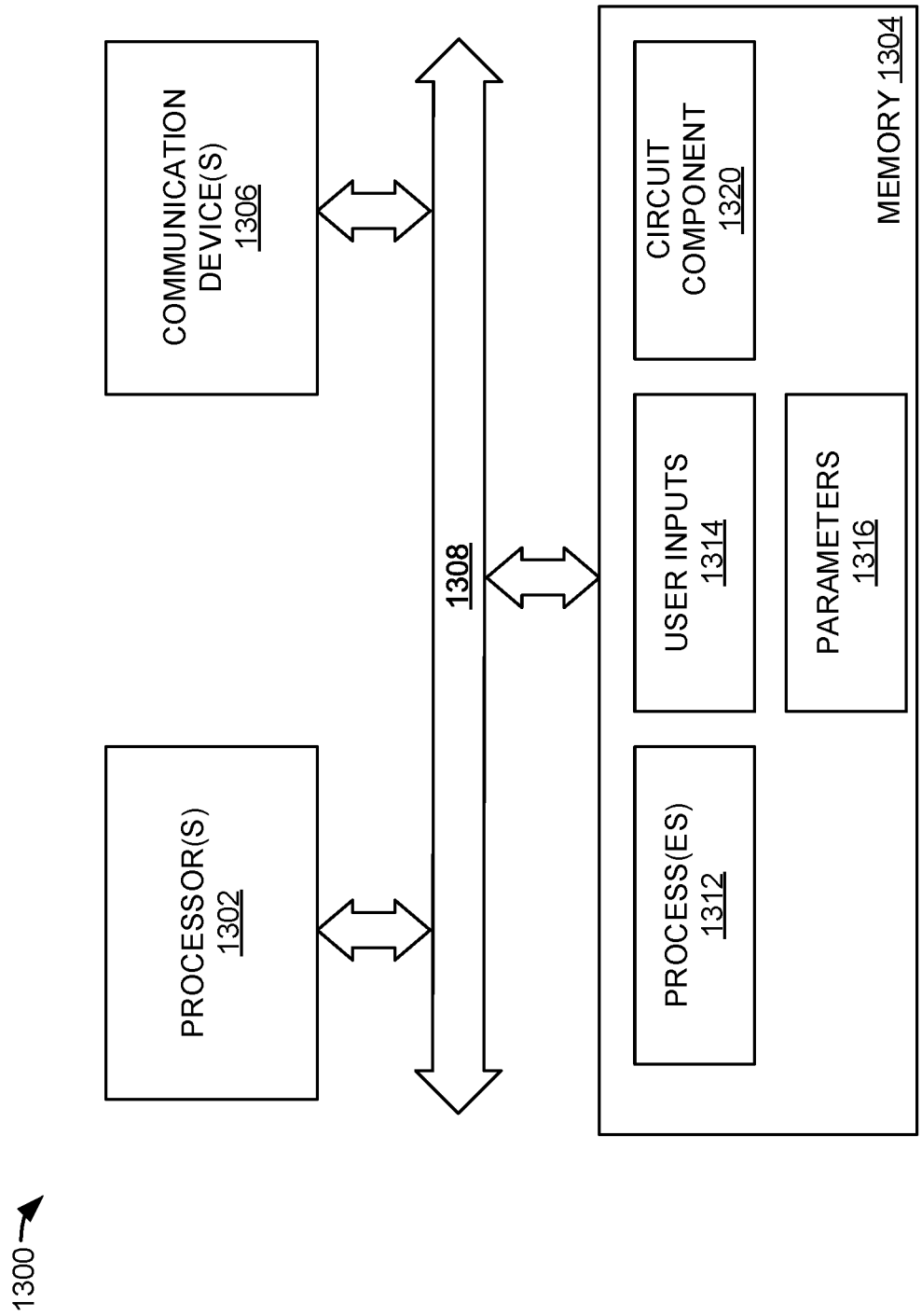
FIG. 13 is a block diagram illustrating one embodiment of a processing system for including, processing, or generating, a circuit component or a representation of a circuit component.

FIG. 13 is a block diagram illustrating one embodiment of a processing system 1300 for including, processing, or generating, a representation of a circuit component 1320. Processing system 1300 includes one or more processors 1302, a memory 1304, and one or more communications devices 1306. Processors 1302, memory 1304, and communications devices 1306 communicate using any suitable type, number, and/or configuration of wired and/or wireless connections 1308.

Processors 1302 execute instructions of one or more processes 1312 stored in a memory 1304 to process and/or generate circuit component 1320 responsive to user inputs 1314 and parameters 1316. Processes 1312 may be any suitable electronic design automation (EDA) tool or portion thereof used to design, simulate, analyze, and/or verify electronic circuitry and/or generate photomasks for electronic circuitry. Representation 1320 includes data that describes all or portions of module 100, module 200, module 300, module 400, module 600, module 700, module 800, module 900, module 1000, module 1100, and/or module 1200, as shown in the Figures.

Representation 1320 may include one or more of behavioral, register transfer, logic component, transistor, and layout geometry-level descriptions. Moreover, representation 1320 may be stored on storage media or communicated by carrier waves.

Data formats in which representation 1320 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1314 may comprise input parameters from a keyboard, mouse, voice recognition interface, microphone and speakers, graphical display, touch screen, or other type of user interface device. This user interface may be distributed among multiple interface devices. Parameters 1316 may include specifications and/or characteristics that are input to help define representation 1320. For example, parameters 1316 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1304 includes any suitable type, number, and/or configuration of non-transitory computer-readable storage media that stores processes 1312, user inputs 1314, parameters 1316, and circuit component 1320.

Communications devices 1306 include any suitable type, number, and/or configuration of wired and/or wireless devices that transmit information from processing system 1300 to another processing or storage system (not shown) and/or receive information from another processing or storage system (not shown). For example, communications devices 1306 may transmit circuit component 1320 to another system. Communications devices 1306 may receive processes 1312, user inputs 1314, parameters 1316, and/or circuit component 1320 and cause processes 1312, user inputs 1314, parameters 1316, and/or circuit component 1320 to be stored in memory 1304.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A dynamic random access memory device (DRAM), comprising:
    a plurality of memory cells;
    a control interface to receive:
        a memory access command that specifies an access to the plurality of memory cells; and,
        a first register access command that specifies a first register access;
    a data interface to receive:
        data to be stored in the plurality of memory cells in response to the memory access command; and
        a code to indicate to the DRAM that the DRAM is to store a device identification value received via the control interface in response to the first register access command.

2. The DRAM of claim 1, wherein the device identification value is written to a device identification value register.

3. The DRAM of claim 2, wherein the control interface is to further receive a target identification value.

4. The DRAM of claim 3, wherein the target identification value is written to a target identification value register.

5. The DRAM of claim 4, wherein the control interface is to further receive a second register access command that specifies a second register access; and,
    in response to at least the second register access command and the target identification value matching the device identification value, the DRAM is to perform the second register access command.

6. The DRAM of claim 4, wherein the control interface is to further receive a second register access command that specifies a second register access; and,
    in response to at least the target identification value not matching the device identification value, the DRAM is not to perform the second register access command.

7. The DRAM of claim 1, wherein the control interface is to further receive:
    a second register access command that specifies a second register access that specifies a target identification value; and,
    a third register access command that specifies a third register access, the third register access command to be performed based at least in part on the device identification value matching the target identification value and the third register access command to not be performed based at least in part on the device identification value not matching the target identification value.

8. A memory module, comprising:
    a module control interface;
    a module data interface;
    a first dynamic random access memory device (DRAM) having a first plurality of memory cells, the first DRAM also having a first control interface coupled to the module control interface to receive commands received by the module control interface, and also having a first data interface coupled to the module data interface;
    a second DRAM having a second plurality of memory cells, the second DRAM also having a second control interface coupled to the module control interface to receive commands received by the module control interface, and also having a second data interface coupled to the module data interface;
    the module control interface to:
        receive a memory access command that specifies an access to the first plurality of memory cells and the second plurality of memory cells;

receive a first register access command that specifies a first register access; and, receive a second register access command that specifies a second register access;

the module data interface to:

receive data to be stored in the first plurality of memory cells and the second plurality of memory cells in response to the memory access command;

receive a first indicator to enable the first DRAM to store a first device identification value in response to the first register access command; and, receive a second indicator to enable the second DRAM to store a second device identification value in response to the second register access command, the first device identification value and the second device identification value to be not equal.

9. The memory module of claim 8, wherein the module control interface is to further receive:

a third register access command that specifies a third register access that specifies a target identification value.

10. The memory module of claim 9, wherein the module control interface is to further receive:

a fourth register access command that specifies a fourth register access, the fourth register access command to be performed by the first DRAM based at least in part on the first device identification value being equal to the target identification value and the fourth register access command to not be performed by the second DRAM based at least in part on the second device identification value being not equal to the target identification value.

11. The memory module of claim 9, wherein the module control interface is to further receive:

a fourth register access command that specifies a fourth register access, the fourth register access command to not be performed by the first DRAM based at least in part on the first device identification value being not equal to the target identification value and the fourth register access command to be performed by the second DRAM based at least in part on the second device identification value being equal to the target identification value.

12. The memory module of claim 8, wherein the module control interface is to further receive:

a third register access command that specifies a third register access that specifies a target identification value to be stored by the first DRAM in a first target identification register and be stored by the second DRAM in a second target identification register.

13. The memory module of claim 12, wherein the module control interface is to further receive:

a fourth register access command that specifies a fourth register access, the fourth register access command to be performed by the first DRAM based at least in part on the first device identification value being equal to the target identification value stored by the first target identification register, and the fourth register access command to not be performed by the second DRAM based at least in part on the second device identification value being not equal to the target identification value stored by the second target identification register.

14. The memory module of claim 13, wherein the module control interface is to further receive:

a fifth register access command that specifies a fifth register access, the fifth register access command to not be performed by the first DRAM based at least in part on the first device identification value being not equal to the target identification value stored by the first target identification register, and the fifth register access command to be performed by the second DRAM based at least in part on the second device identification value being equal to the target identification value stored by the second target identification register.

15. A method of operating a dynamic random access device (DRAM), comprising:

receiving, at a control interface, a memory access command that specifies an access to a plurality of memory cells comprising the DRAM;

receiving, at the control interface, a first register access command that specifies a first register access;

receiving, at a data interface, data to be stored in the plurality of memory cells in response to the memory access command; and receiving, at the data interface, at least one indicator that indicates to the DRAM that the DRAM is to store a device identification value in response to the first register access command, the device identification value to be received via the control interface.

16. The method of claim 15, further comprising:

based at least in part on the at least one indicator, writing the device identification value to a device identification register.

17. The method of claim 16, further comprising:

receiving, at the control interface, a target identification value.

18. The method of claim 17, further comprising:

writing the target identification value to a target identification register.

19. The method of claim 18, further comprising:

receiving, at the control interface, a second register access command that specifies a second register access; and, based at least in part on the second register access command and the target identification value in the target identification register being equal to the device identification value in the device identification register, performing the second register access command.

20. The method of claim 18, further comprising:

receiving, at the control interface, a second register access command that specifies a second register access; and, based at least in part on the second register access command and the target identification value in the target identification register being not equal to the device identification value in the device identification register, not performing the second register access command.

* * * * *